US012765143B2

United States Patent
(12) United States Patent
Kim et al.

(10) Patent No.: US 12,765,143 B2
(45) Date of Patent: Oct. 13, 2026

(54) DISPLAY DEVICE HAVING AN ALIGNMENT AREA SURROUNDED BY BANK PATTERNS

(71) Applicant: Samsung Display Co., LTD., Yongin-si (KR)

(72) Inventors: Hoon Kim, Yongin-si (KR); Min Joo Kim, Yongin-si (KR); Je Won Yoo, Yongin-si (KR); Seung Kyu Lee, Yongin-si (KR); Yong Sik Hwang, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 654 days.

(21) Appl. No.: 18/114,407

(22) Filed: Feb. 27, 2023

(65) Prior Publication Data

US 2023/0387369 A1 Nov. 30, 2023

(30) Foreign Application Priority Data

May 30, 2022 (KR) ........................ 10-2022-0066069

(51) Int. Cl.
*H10H 20/857* (2025.01)
*H10D 86/40* (2025.01)
(Continued)

(52) U.S. Cl.
CPC ........ *H10H 20/857* (2025.01); *H10D 86/441* (2025.01); *H10D 86/481* (2025.01); *H10D 86/60* (2025.01); *H10W 90/00* (2026.01)

(58) Field of Classification Search
CPC .... H10H 20/857; H10H 20/83; H10H 29/142; H01L 25/0753; H01L 25/167;
(Continued)

(56) References Cited

U.S. PATENT DOCUMENTS 11,550,087 B2 1/2023 Park et al.
2021/0057623 A1* 2/2021 Kim ........................ H10H 20/84
(Continued)

FOREIGN PATENT DOCUMENTS

KR 10-0601370 7/2006
KR 10-2021-0148539 12/2021
(Continued)

OTHER PUBLICATIONS

Korean Notice of Allowance issued in corresponding KR Application No. 10-2022-0066069, dated Jul. 9, 2026, 2 pages.

*Primary Examiner* — Wael M Fahmy
*Assistant Examiner* — Tiberiu Dan Onuta
(74) *Attorney, Agent, or Firm* — Womble Bond Dickinson (US) LLP

(57) ABSTRACT

A display device comprises conductive layers disposed on a substrate in different layers, a via layer on the conductive layers, a bank disposed on the via layer and defining a light emission area, bank patterns on the via layer and extended in a first direction, a first electrode on the bank patterns and extended in the first direction, and a second electrode disposed on the bank patterns and extended in the first direction, and light emitting elements on the first electrode and the second electrode. The bank patterns are spaced apart from each other. The first and second electrodes are spaced apart from each other. The bank and the bank patterns define an alignment area in which the light emitting elements are disposed. An area, in which two or more of the conductive layers overlap each other in a plan view is about 80% or more in the alignment area.

20 Claims, 18 Drawing Sheets

(51) Int. Cl.
*H10D 86/60* (2025.01)
*H10W 90/00* (2026.01)

(58) Field of Classification Search
CPC .... H10D 86/441; H10D 86/481; H10D 86/60; H10D 86/451
See application file for complete search history.

(56) References Cited

U.S. PATENT DOCUMENTS

| | | | | |
|---|---|---|---|---|
| 2022/0140194 | A1* | 5/2022 | Song | H10H 20/8312 257/40 |
| 2022/0365397 | A1* | 11/2022 | Douyou | G02F 1/13685 |
| 2022/0384697 | A1* | 12/2022 | Lin | H10H 20/857 |

FOREIGN PATENT DOCUMENTS

| | | | |
|---|---|---|---|
| KR | 10-2022-0006164 | A | 1/2022 |
| KR | 10-2022-0067654 | A | 5/2022 |

* cited by examiner

RME: RME1, RME2, RME3
CNE: CNE1, CNE2, CNE3
ED: ED1, ED2

DISPLAY DEVICE HAVING AN ALIGNMENT AREA SURROUNDED BY BANK PATTERNS

CROSS-REFERENCE TO RELATED APPLICATION

This application claims priority to and benefits of Korean Patent Application No. 10-2022-0066069 under 35 U.S.C. § 119, filed in the Korean Intellectual Property Office on May 30, 2022, the entire contents of which are incorporated herein by reference.

BACKGROUND

1. Technical Field

The disclosure relates to a display device.

2. Description of the Related Art

With the advancement of multimedia, importance of a display device has been increased. Accordingly, various types of display devices such as an organic light emitting display (OLED) device and a liquid crystal display (LCD) device have been used.

There is a display panel such as an organic light emitting display panel and a liquid crystal display panel as a device for displaying an image of a display device. The display device may include a light emitting element as a light emitting display panel, and for example, a light emitting diode (LED) includes an organic light emitting diode (OLED) that uses an organic material as a light emitting material, and an inorganic light emitting diode that uses an inorganic material as a light emitting material.

It is to be understood that this background of the technology section is, in part, intended to provide useful background for understanding the technology. However, this background of the technology section may also include ideas, concepts, or recognitions that were not part of what was appreciated by those skilled in the pertinent art prior to a corresponding effective filing date of the subject matter disclosed herein.

SUMMARY

One of the of the disclosure is to provide a display device that may prevent a critical dimension of an insulating layer formed above lower conductive layers from varying due to a step difference of the lower conductive layers.

The objects of the disclosure are not limited to those mentioned above and additional objects of the disclosure, which are not mentioned herein, will be clearly understood by those skilled in the art from the following description of the disclosure.

According to an embodiment of the disclosure, a display device comprises a plurality of conductive layers disposed on a substrate in different layers, a via layer disposed on the plurality of conductive layers, a bank disposed on the via layer and partitioning a light emission area, bank patterns disposed on the via layer and extended in a first direction, a first electrode disposed on the bank patterns and extended in the first direction, a second electrode disposed on the bank patterns and extended in the first direction, and light emitting elements disposed on the first electrode and the second electrode. The bank patterns are spaced apart from one another. The first electrode and the second electrode are spaced apart from one another. The bank and the bank patterns partition an alignment area in which the light emitting elements are disposed. An area in which two or more of the plurality of conductive layers overlap one another in a plan view, is about 80% or more in the alignment area.

In an embodiment, the bank patterns may include a first bank pattern overlapping the first electrode in a plan view, and a second bank pattern overlapping the second electrode in a plan view. The alignment area may be surrounded by the bank, the first bank pattern, and the second bank pattern.

In an embodiment, the plurality of conductive layers may include a first conductive layer disposed on the substrate, a second conductive layer disposed on the first conductive layer, and a third conductive layer disposed on the second conductive layer.

In an embodiment, an area in which the first conductive layer and the third conductive layer overlap one another in a plan view may be about 80% or more in the alignment area.

In an embodiment, an area in which the first conductive layer and the second conductive layer overlap one another in a plan view, may be about 80% or more in the alignment area.

In an embodiment, an area in which the first conductive layer, the second conductive layer, and the third conductive layer overlap one another in a plan view, may be about 80% or more in the alignment area.

In an embodiment, the display device may further comprise a lower metal layer disposed on the substrate, and at least one transistor disposed on the lower metal layer. The transistor may include a semiconductor layer, a gate electrode disposed on the semiconductor layer, a source electrode disposed on the gate electrode, and a drain electrode disposed on the gate electrode. The first conductive layer may include the lower metal layer. The second conductive layer may include the gate electrode. The third conductive layer may include the source electrode and the drain electrode.

In an embodiment, the display device may further comprise a buffer layer disposed between the first conductive layer and the second conductive layer, a gate insulating layer disposed between the first conductive layer and the second conductive layer, and an interlayer insulating layer disposed between the second conductive layer and the third conductive layer.

In an embodiment, the display device may further comprise a first connection electrode that is in contact with an end of each of the light emitting elements, and a second connection electrode that is in contact with another end of each of the light emitting elements.

According to an embodiment of the disclosure, a display device comprises a plurality of pixels, each of the plurality of pixels including bank patterns disposed on a substrate, extended in a first direction, and spaced apart from one another in a second direction, a bank disposed on the bank patterns and partitioning a light emission area, a plurality of first electrodes disposed on the bank patterns, a plurality of second electrodes disposed on the bank patterns, a plurality of subpixels including a first subpixel including a plurality of light emitting elements on a first electrode of the plurality of first electrodes and a second electrode of the plurality of second electrodes, a second subpixel including a plurality of light emitting elements on a first electrode of the plurality of first electrodes and a second electrode of the plurality of second electrodes, and disposed adjacent to the first subpixel in a second direction, and a third subpixel including a plurality of light emitting elements on a first electrode of the plurality of first electrodes and a second electrode of the plurality of second electrodes, and disposed adjacent to the second subpixel in the second direction, a first scan line extended in the first direction, a first gate pattern overlapping the first scan line in a plan view and electrically connected to the first scan line, and a first conductive pattern overlapping the first scan line and the first gate pattern in a plan view and electrically connected to the first scan line. The plurality of first electrodes and the plurality of second electrodes are spaced apart from each other in the second direction. The first scan line, the first gate pattern, and the first conductive pattern are disposed in the first subpixel. The bank and the bank patterns partition an alignment area, in which the light emitting elements are disposed, in each of the plurality of subpixels. An area in which the first scan line and the first gate pattern overlap one another in a plan view, is about 80% or more in the alignment area of the first subpixel.

In an embodiment, the first scan line may be disposed on the substrate. The first gate pattern may be disposed on the first scan line. The first conductive pattern may be disposed on the first gate pattern.

In an embodiment, an area in which the first scan line, the first gate pattern, and the first conductive pattern overlap one another in a plan view, may be about 80% or more in the alignment area of the first subpixel.

In an embodiment, the second subpixel includes a plurality of lower metal layers disposed on the substrate, transistors disposed on the plurality of lower metal layers and electrically connected to the first electrode of the plurality of first electrodes disposed in each of the plurality of subpixels, and capacitors disposed on the plurality of lower metal layers and electrically connected to the first electrode of the plurality of first electrodes disposed in each of the plurality of subpixels, and each of the capacitors including a first capacitance electrode and a second capacitance electrode overlapping the first capacitance electrode in a plan view.

In an embodiment, an area, in which the lower metal layer and the second capacitance electrode overlap one another in a plan view, may be about 80% or more in the alignment area of the second subpixel.

In an embodiment, an area in which the lower metal layer, the first capacitance electrode, and the second capacitance electrode overlap one another in a plan view may be about 80% or more in the alignment area of the second subpixel.

In an embodiment, the third subpixel may include a first data line extended in the first direction, a second data line extended in the first direction, a third data line extended in the first direction, second conductive patterns electrically connected to the first data line, the second data line, and the third data line, respectively, and a second capacitance electrode extended from the second subpixel. The first to third data lines may be spaced apart from one another in the second direction.

In an embodiment, an area in which the second data line, the second conductive patterns and the second capacitance electrode overlap one another in a plan view, may be about 80% or more in the alignment area of the third subpixel.

In an embodiment, the third subpixel may include a first dummy pattern disposed between the second data line and the second capacitance electrode, a second dummy pattern disposed between the second data line and the second conductive patterns, and a third dummy pattern disposed between the second data line and the second conductive patterns. An area in which the second data line, the first to third dummy patterns, the second conductive patterns, and the second capacitance electrode overlap one another in a plan view, may be about 80% or more in the alignment area of the third subpixel.

In an embodiment, the first data line, the second data line, and the third data line may be disposed on the substrate. The first dummy pattern, the second dummy pattern, and the third dummy pattern may be disposed on the first data line, the second data line, and the third data line. The second capacitance electrode and the second conductive patterns may be disposed on the first dummy pattern, the second dummy pattern, and the third dummy pattern.

In an embodiment, the first dummy pattern, the second dummy pattern, and the third dummy pattern may be spaced apart from one another, and may be floating patterns.

In the display device according to embodiments, an area, in which two or more conductive layers (the conductive layers disposed below an alignment area in which light emitting elements are aligned) overlap each other in a plan view, may be formed to occupy about 80% or more with respect to the alignment area. Therefore, a via layer below the light emitting elements may be flat, and a critical dimension of an insulating layer disposed above the via layer may be prevented from being distorted. Thus, a contact defect between the light emitting element and a connection electrode may be prevented from occurring.

The effects according to the embodiments of the disclosure are not limited to those mentioned above and more various effects are included in the following description of the disclosure.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
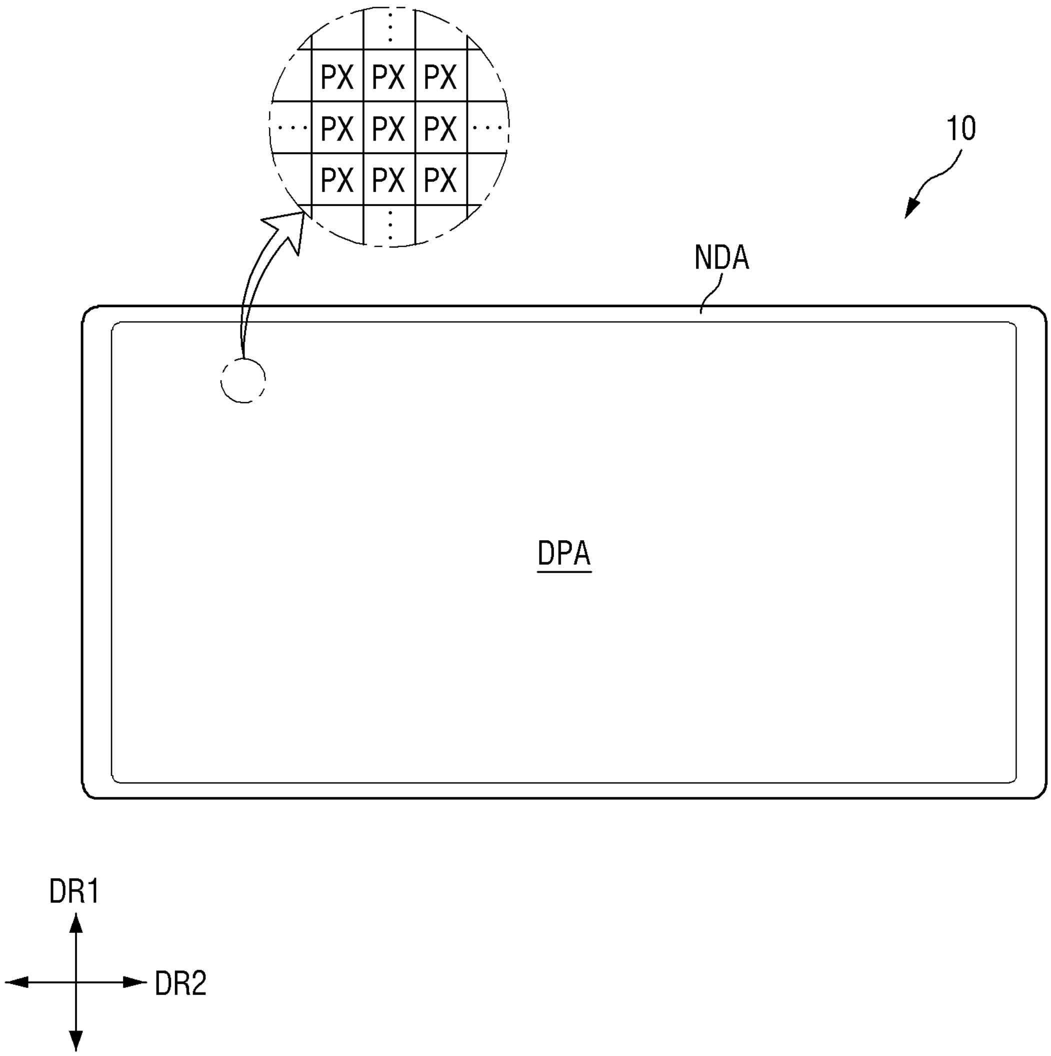
FIG. 1 is a schematic plan view illustrating a display device according to an embodiment.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will filly convey the scope of the invention to those skilled in the art.

Unless otherwise specified, the illustrated embodiments are to be understood as providing features of the disclosure. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the disclosure.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements.

Although the terms "first," "second," and the like may be used herein to describe various types of elements, these elements should not be limited by these terms. These terms are used to distinguish one element from another element. Thus, a first element discussed below could be termed a second element without departing from the teachings of the disclosure. Similarly, the second element could also be termed the first element.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein should be interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various embodiments are described herein with reference to sectional and/or exploded illustrations that are schematic illustrations of embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

For the purposes of this disclosure, the phrase "at least one of A and B" may be construed as A only, B only, or any combination of A and B. Also, "at least one of X, Y, and Z" and "at least one selected from the group consisting of X, Y, and Z" may be construed as X only, Y only, Z only, or any combination of two or more of X, Y, and Z.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Each of the features of the various embodiments of the disclosure may be combined or combined with each other, in part or in whole, and technically various interlocking and driving are possible. Each embodiment may be implemented independently of each other or may be implemented together in an association.

Hereinafter, detailed embodiments of the disclosure is described with reference to the accompanying drawings.

FIG. 1 is a schematic plan view illustrating a display device according to an embodiment.

Referring to FIG. 1, a display device 10 displays a moving image or a still image. The display device 10 may refer to all electronic devices that provide a display screen. For example, a television, a laptop computer, a monitor, an advertising board, Internet of Things (IOT), a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder, and the like, which provide a display screen, may be included in the display device 10.

The display device 10 may include a display panel for providing a display screen. Examples of the display panel may include an inorganic light emitting diode display panel, an organic light emitting display panel, a quantum dot light emitting display panel, a plasma display panel, a field emission display panel, or the like. Hereinafter, the inorganic light emitting diode display panel may be applied as an example of the display panel, but the example of the display panel is not limited thereto. Other display panels may be used when the same technical spirits are applicable thereto.

Various modifications may be made in a shape of the display device 10. For example, the display device 10 may have a rectangular shape that is long in a horizontal direction, a rectangular shape that is long in a vertical direction, a square shape, a square shape with rounded corners (vertexes), other polygonal shapes, a circular shape, etc. A shape of a display area DPA of the display device 10 may be also similar to an overall shape of the display device 10. A display device 10 of a rectangular shape that is longer in a second direction DR2 is illustrated in FIG. 1.

The display device 10 may include a display area DPA and a non-display area NDA. The display area DPA may be an area in which a screen may be displayed, and the non-display area NDA may be an area in which a screen is not displayed. The display area DPA may be referred to as an active area, and the non-display area NDA may be referred to as a non-active area. The display area DPA may occupy a center of the display device 10.

The display area DPA may include pixels PX. The pixels PX may be disposed in a matrix direction. A shape of each pixel PX may be a rectangular or square shape in a plan view, but the disclosure is not limited thereto. The shape of each pixel PX may be a rhombus shape in which each side is inclined with respect to a direction. Each of the pixels PX may be disposed in a stripe type or an island type. Also, each of the pixels PX may include one or more light emitting elements for emitting light of a wavelength band (e.g., a specific or selectable wavelength band) to display a color (e.g., a specific or selectable color).

The non-display area NDA may be disposed in a vicinity of (or adjacent to) the display area DPA. The non-display area NDA may fully or partially surround the display area DPA. The display area DPA may be rectangular in a shape, and the non-display area NDA may be adjacent to four sides of the display area DPA. The non-display area NDA may constitute a bezel of the display device 10. Lines or circuit drivers included in the display device 10 may be disposed in the non-display areas NDA, or external devices may be packaged in the non-display area NDA.

Figure 2:
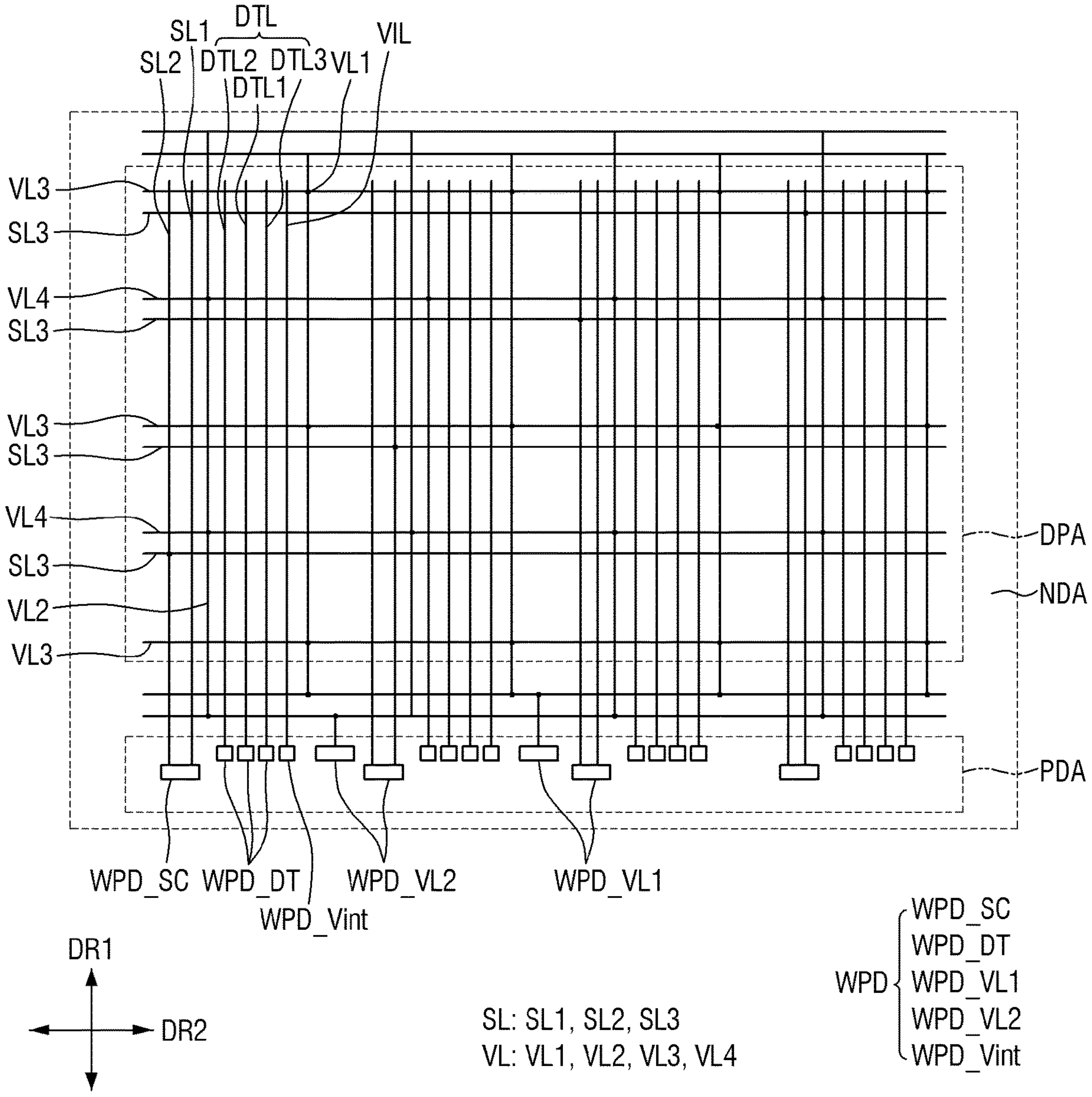
FIG. 2 is a schematic plan view illustrating an arrangement of lines included in a display device according to an embodiment.

FIG. 2 is a schematic plan view illustrating an arrangement of lines included in a display device according to an embodiment.

Referring to FIG. 2, the display device 10 may include lines. The display device 10 may include scan lines SL (e.g., a first scan line SL1, a second scan line SL2, and a third scan line SL3), data lines DTL (e.g., a first data line DTL1, a second data line DTL2, and a third data line DTL3), an initialization voltage line VIL, and voltage lines VL (a first voltage line VL1, a second voltage line VL2, a third voltage line VL3, and a fourth voltage line VL4). Although not shown, the display device 10 may further include other lines. The lines of the display device 10 may include lines made of (or include) a first conductive layer and extended in the second direction DR2, and lines made of a third conductive layer and extended in the second direction DR2, but an extension direction of each of the lines is not limited thereto.

The first scan line SL1 and the second scan line SL2 may be disposed to be extended in a first direction DR1. The first scan line SL1 and the second scan line SL2 may be disposed to be adjacent to each other, and another first scan line SL1 and another second scan line SL2 may be disposed to be spaced apart from each other in the second direction DR2. For example, the first scan line SL1 and the second scan line SL2 may be spaced apart from the another first scan line SL1 and the another second scan line SL2 in the second direction DR2. The first scan line SL1 and the second scan line SL2 may be electrically connected to a scan line pad WPD_SC electrically connected to a scan driver (not shown). The first scan line SL1 and the second scan line SL2 may be extended from a pad area PDA disposed in the non-display area NDA to the display area DPA.

The third scan line SL3 may be disposed to be extended in the second direction DR2, and may be disposed to be spaced apart from another third scan line SL3 in the first direction DR1. A single third scan line SL3 may be electrically connected to one or more first scan lines SL1 or one or more second scan lines SL2. The scan lines SL (e.g., the first scan line SL1, the second scan line SL2, and the third scan line SL3) may have a mesh structure on a front surface of the display area DPA, but the disclosure is not limited thereto.

The data lines DTL may be disposed to be extended in the first direction DR1. The data line DTL may include a first data line DTL1, a second data line DTL2, and a third data line DTL3. The first to third data lines DTL1, DTL2, and DTL3 may be disposed in a pair and be adjacent to one another.. Each of the data lines DTL1, DTL2, and DTL3 may be disposed to be extended from the pad area PDA disposed in the non-display area NDA to the display area DPA, but the disclosure is not limited thereto. The data lines DTL may be disposed to be spaced from each other at intervals (e.g., equivalent or uniform intervals) between the first voltage line VL1 and the second voltage line VL2. Detailed description of the first voltage line VL1 and the second voltage line VL2 is provided below.

The initialization voltage line VIL may be disposed to be extended in the first direction DR1. The initialization voltage line VIL may be disposed between the data lines DTL and the first voltage line VL1. The initialization voltage line VIL may be disposed to be extended from the pad area PDA disposed in the non-display area NDA to the display area DPA.

The first voltage line VL1 and the second voltage line VL2 may be disposed to be extended in the first direction DR1, and the third voltage line VL3 and the fourth voltage line VL4 may be disposed to be extended in the second direction DR2. The first voltage line VL1 and the second voltage line VL2 may be alternately disposed in the second direction DR2, and the third voltage line VL3 and the fourth voltage line VL4 may be alternately disposed in the first direction DR1. The first voltage line VL1 and the second voltage line VL2 may be disposed to be extended in the first direction DR1 and cross (or intersect) the display area DPA. Some lines of the third voltage line VL3 and the fourth voltage line VL4 may be disposed in the display area DPA, and other lines thereof may be disposed in the non-display area NDA positioned on both sides (e.g., an upper side or a lower side) in the first direction DR1 of the display area DPA. The voltage lines VL may have a mesh structure on the front surface of the display area DPA, but the disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In an embodiment, each line pad WPD may be disposed in the pad area PDA positioned at a lower side (e.g., another side or an opposite side) of the display area DPA in the first direction DR1. The first scan line SL1 and the second scan line SL2 may be electrically connected to the scan line pad WPD_SC disposed in the pad area PDA. The data lines DTL may be electrically connected to different data line pads WPD_DT, respectively. The initialization voltage line VIL may be electrically connected to an initialization line pad WPD-_Vint. The first voltage line VL1 may be electrically connected to a first voltage line pad WPD_VL1. The second voltage line VL2 may be electrically connected to a second voltage line pad WPD_VL2. An external device may be packaged on the line pad WPD. The external device may be packaged on the line pad WPD through an anisotropic conductive film, an ultrasonic bonding, or the like. Each line pad WPD may be illustrated as being disposed in the pad area PDA disposed below the display area DPA, but the disclosure is not limited thereto. Some of the line pads WPD may be disposed on an upper side of the pad area PDA or in any one area of left and right sides of the display area DPA.

Each pixel PX or each subpixel SPXn (n is an integer of 1 to 3) of the display device 10 may include a pixel driving circuit. The above-described lines may apply a driving signal to each pixel driving circuit and pass through each pixel PX or the periphery of each pixel PX. The pixel driving circuit may include a transistor and a capacitor. Various modifications may be made in the number of transistors and capacitors of each pixel driving circuit. According to an embodiment, each subpixel SPXn of the display device 10 may have a 3T1C structure in which the pixel driving circuit includes three transistors and a capacitor. Hereinafter, the pixel driving circuit may be the 3T1C structure as an example, but other various modified structures such as a 2T1C structure, a 7T1C structure, and a 6T1C structure may be applied thereto.

Figure 3:
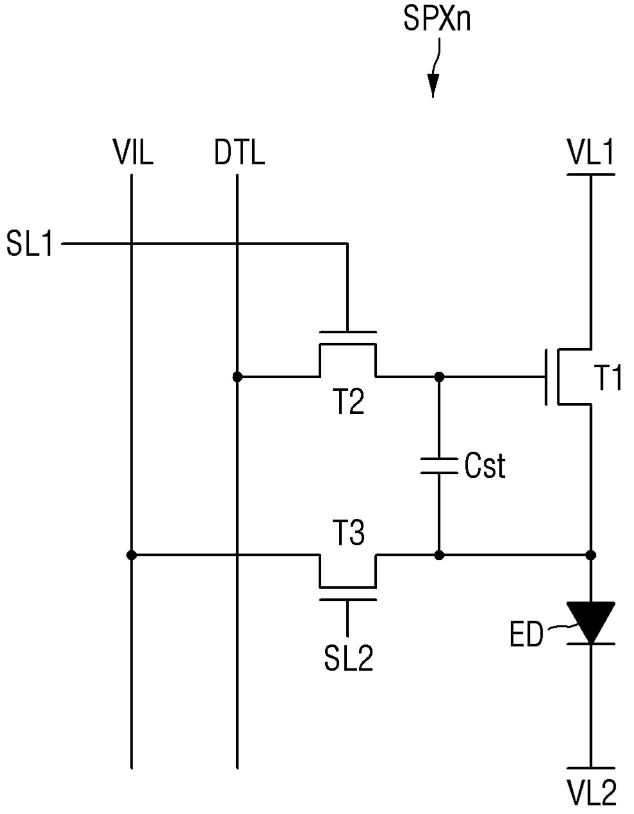
FIG. 3 is a schematic view of an equivalent circuit illustrating a subpixel of a display device according to an embodiment.

FIG. 3 is a schematic view of an equivalent circuit illustrating a subpixel of a display device according to an embodiment;

Referring to FIG. 3, each subpixel SPXn of the display device 10 according to an embodiment may include three transistors T1, T2, and T3, a storage capacitor Cst, and a light emitting diode EL.

The light emitting diode ED may emit light in accordance with a current supplied through the first transistor T1. The light emitting diode ED may include a first electrode, a second electrode, and at least one light emitting element (or light emitting diode) ED disposed between the first electrode and the second electrode. The light emitting element ED may emit light of a wavelength band (e.g., a specific or selectable wavelength band) by an electrical signal transferred from the first electrode and the second electrode.

An end of the light emitting diode ED may be electrically connected to a source electrode of the first transistor T1, and another end thereof may be electrically connected to the second voltage line VL2 supplied with a low potential voltage (hereinafter, second power voltage) lower than a high potential voltage (hereinafter, first power voltage) of the first voltage line VL1.

The first transistor T1 may adjust the current flowing from the first voltage line VL1, to which the first power voltage is supplied, to the light emitting diode ED in accordance with a voltage difference between a gate electrode and a source electrode of the first transistor T1. For example, the first transistor T1 may be a driving transistor for driving the light emitting diode ED. The gate electrode of the first transistor T1 may be electrically connected to a source electrode of the first transistor T2, the source electrode of the first transistor T1 may be electrically connected to the first electrode of the light emitting diode ED, and a drain electrode of the first transistor T1 may be electrically connected to the first voltage line VL1 to which the first power voltage is applied.

The second transistor T2 may be turned on by a scan signal of the first scan line SL1 and electrically connect the data line DTL to the gate electrode of the first transistor T1. A gate electrode of the second transistor T2 may be electrically connected to the first scan line SL1, the source electrode of the second transistor T2 may be electrically connected to the gate electrode of the first transistor T1, and the drain electrode of the second transistor T2 may be electrically connected to the data line DTL.

The third transistor T3 may be turned on by a scan signal of the second scan line SL2 and electrically connect the initialization voltage line VIL to the end of the light emitting diode ED. A gate electrode of the third transistor T3 may be electrically connected to the second scan line SL2, a drain electrode of the third transistor T3 may be electrically connected to the initialization voltage line VIL, and a source electrode of the third transistor T3 may be electrically connected to the end of the light emitting diode ED or the source electrode of the first transistor T1.

In an embodiment, the source electrode and the drain electrode of each of the transistors T1, T2, and T3 are not limited to those described above, and may be vice versa. Each of the transistors T1, T2, and T3 may be formed of a thin film transistor. In FIG. 3, each of the transistors T1, T2, and T3 may be formed of an N-type metal oxide semiconductor field effect transistor (MOSFET), but the disclosure is not limited thereto. For example, each of the transistors T1, T2, and T3 may be formed of a P-type MOSFET, or a portion of the transistors T1, T2, and T3 may be an N-type MOSFET, and another portion thereof may be formed of a P-type MOSFET.

The storage capacitor Cst may be formed between the gate electrode and the source electrode of the first transistor T1. The storage capacitor Cst may store a differential voltage between a gate voltage and a source voltage of the first transistor T1.

The gate electrode of the second transistor T2 may be electrically connected to the first scan line SL1, and the gate electrode of the third transistor T3 may be electrically connected to the second scan line SL2. The first scan line SL1 and the second scan line SL2 may be the scan lines different from each other, and the second transistor T2 and the third transistor T3 may be turned on by the scan signals applied from the different scan lines SL1 and SL2, but the disclosure is not limited thereto. The gate electrodes of the second transistor T2 and the third transistor T3 may be electrically connected to a same scan line, and may be simultaneously turned on by the scan signal applied from the same scan line.

Hereinafter, a structure of each pixel PX of the display device 10 according to an embodiment is described in detail with reference to other drawings.

Figure 4:
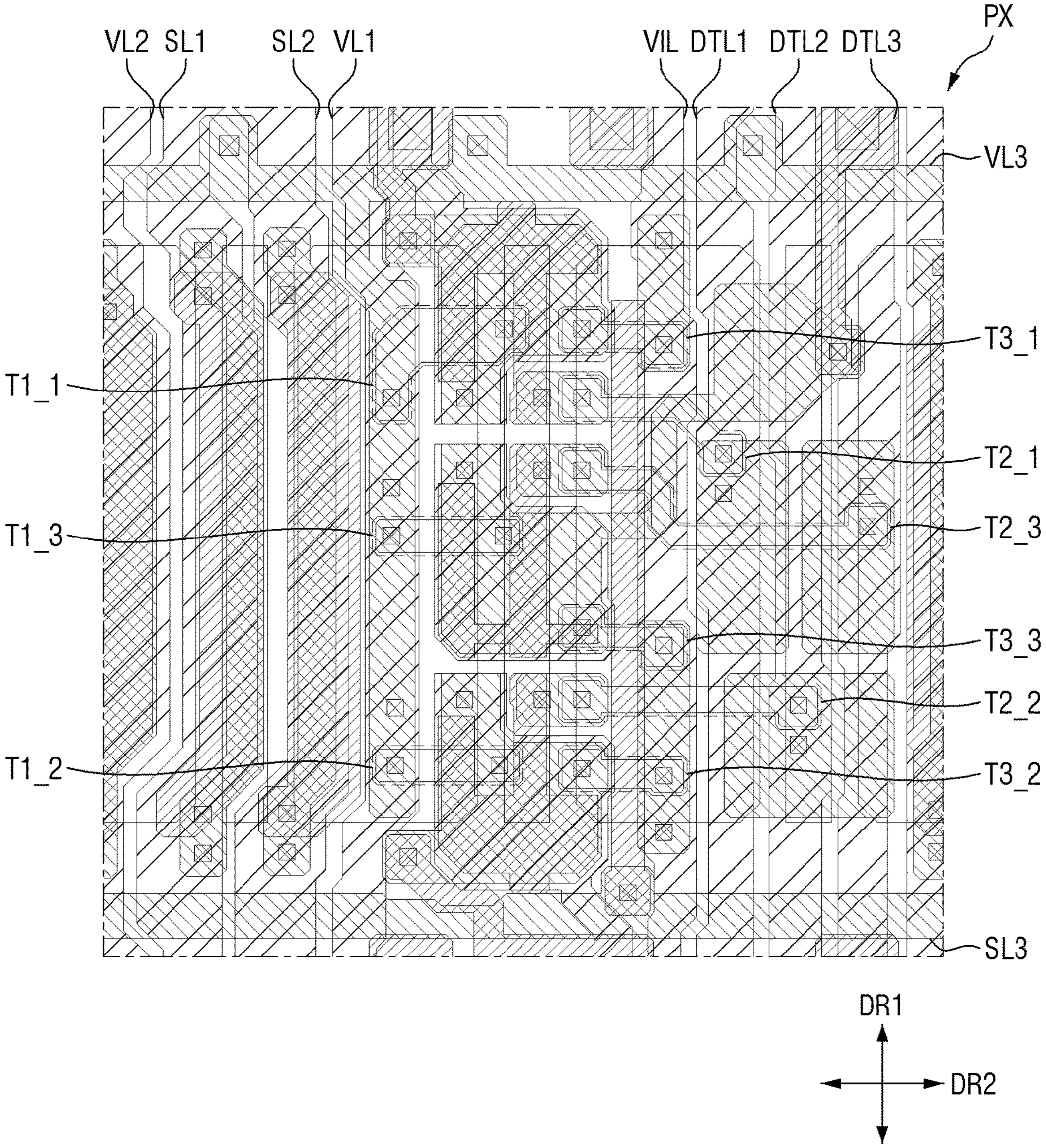
FIG. 4 is a schematic layout view illustrating lines disposed in a pixel of a display device according to an embodiment.
Figure 5:
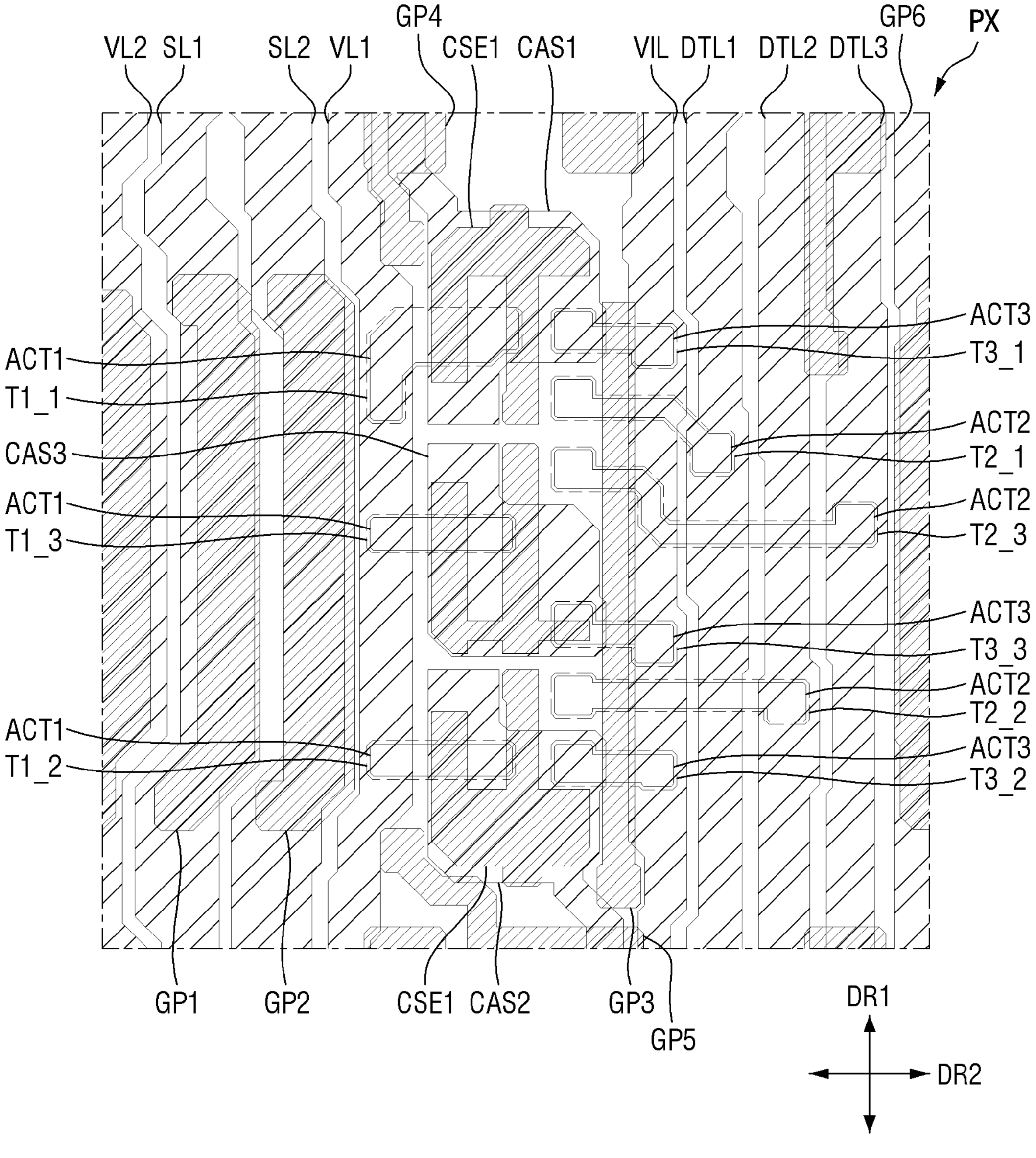
FIGS. 5 and 6 are schematic layout views illustrating some of lines of FIG. 4, which are partitioned.
Figure 6:
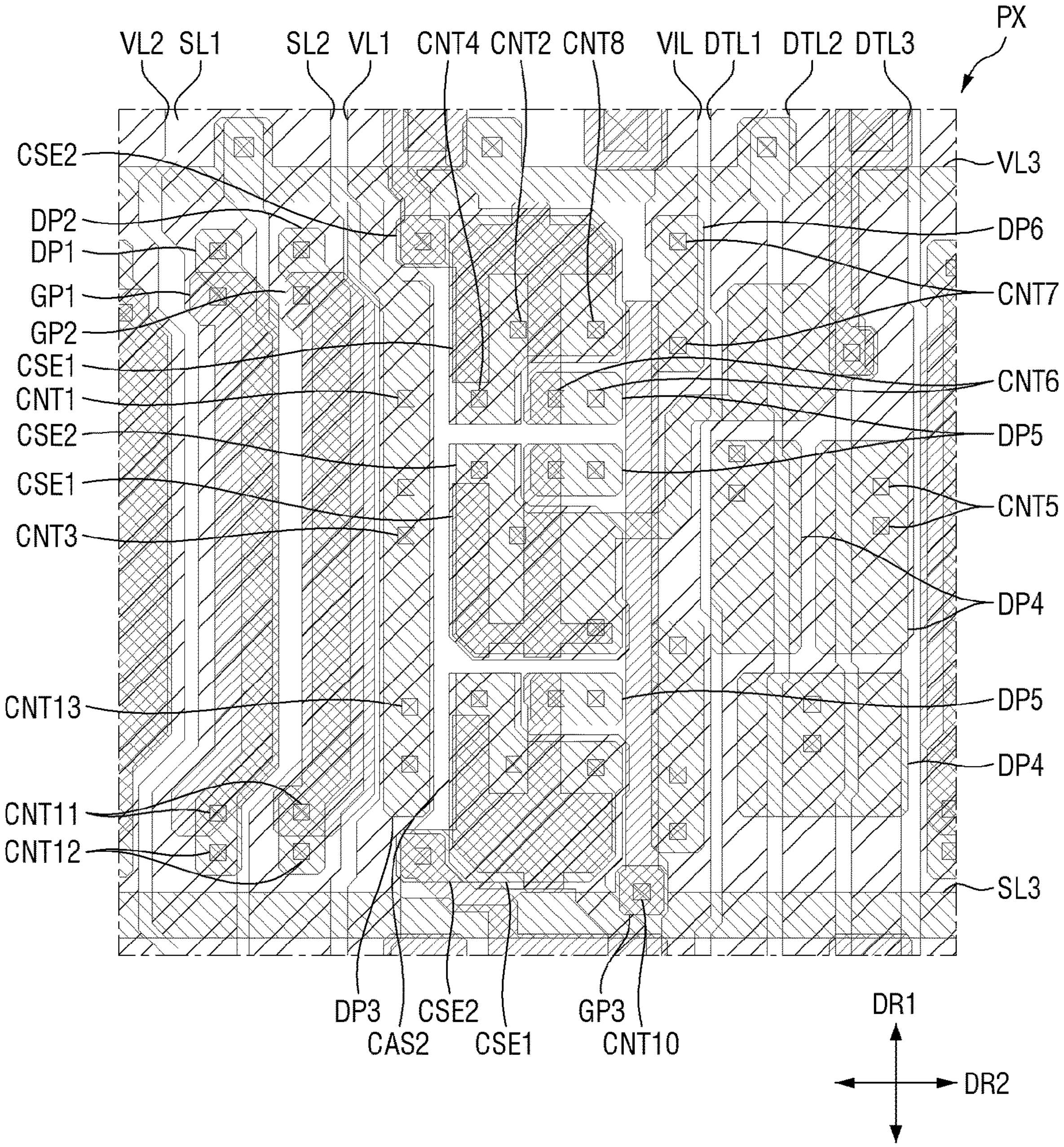
Figure 7:
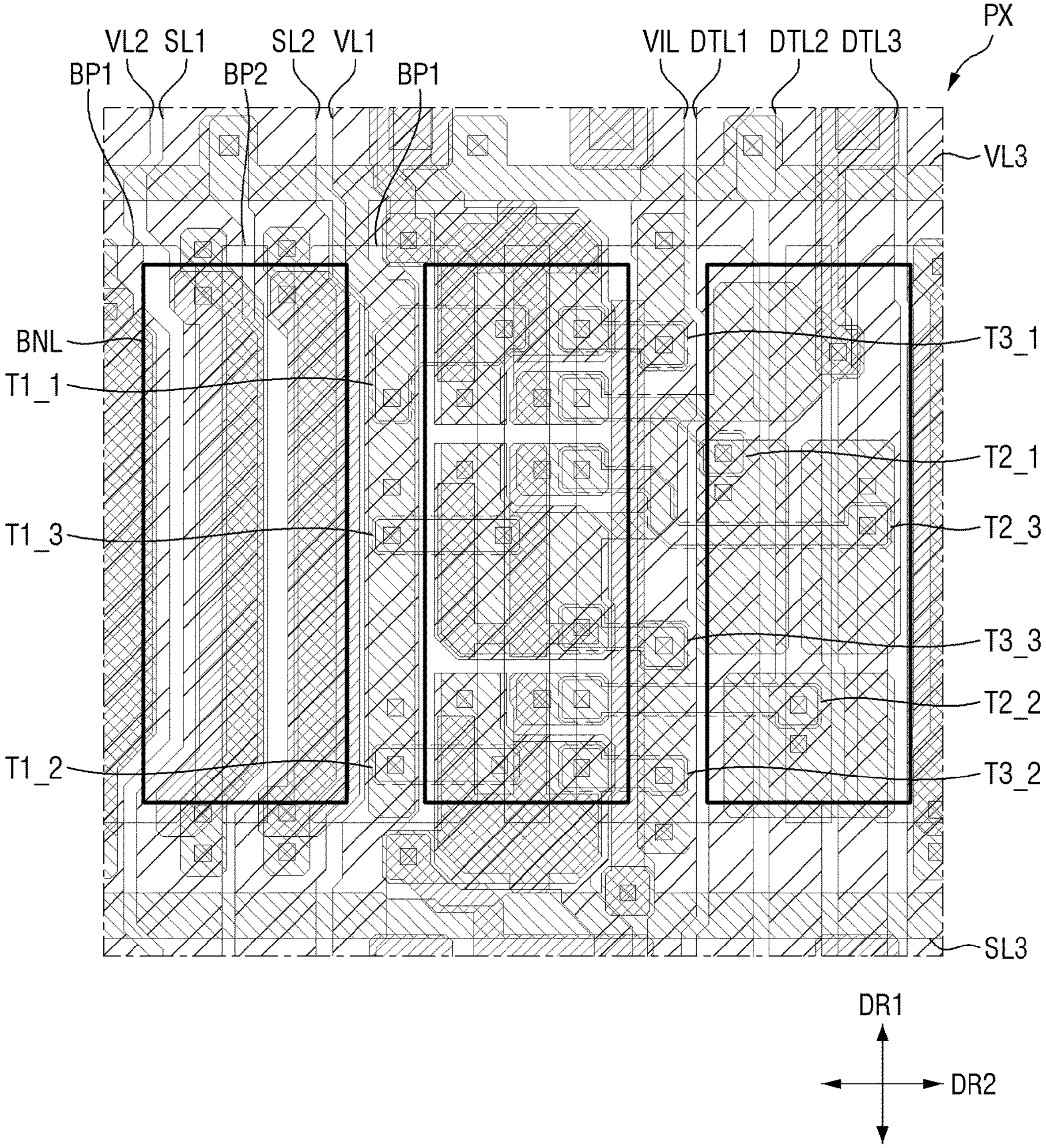
FIG. 7 is a schematic layout view illustrating an arrangement of lines and a bank of FIG. 4.
Figure 8:
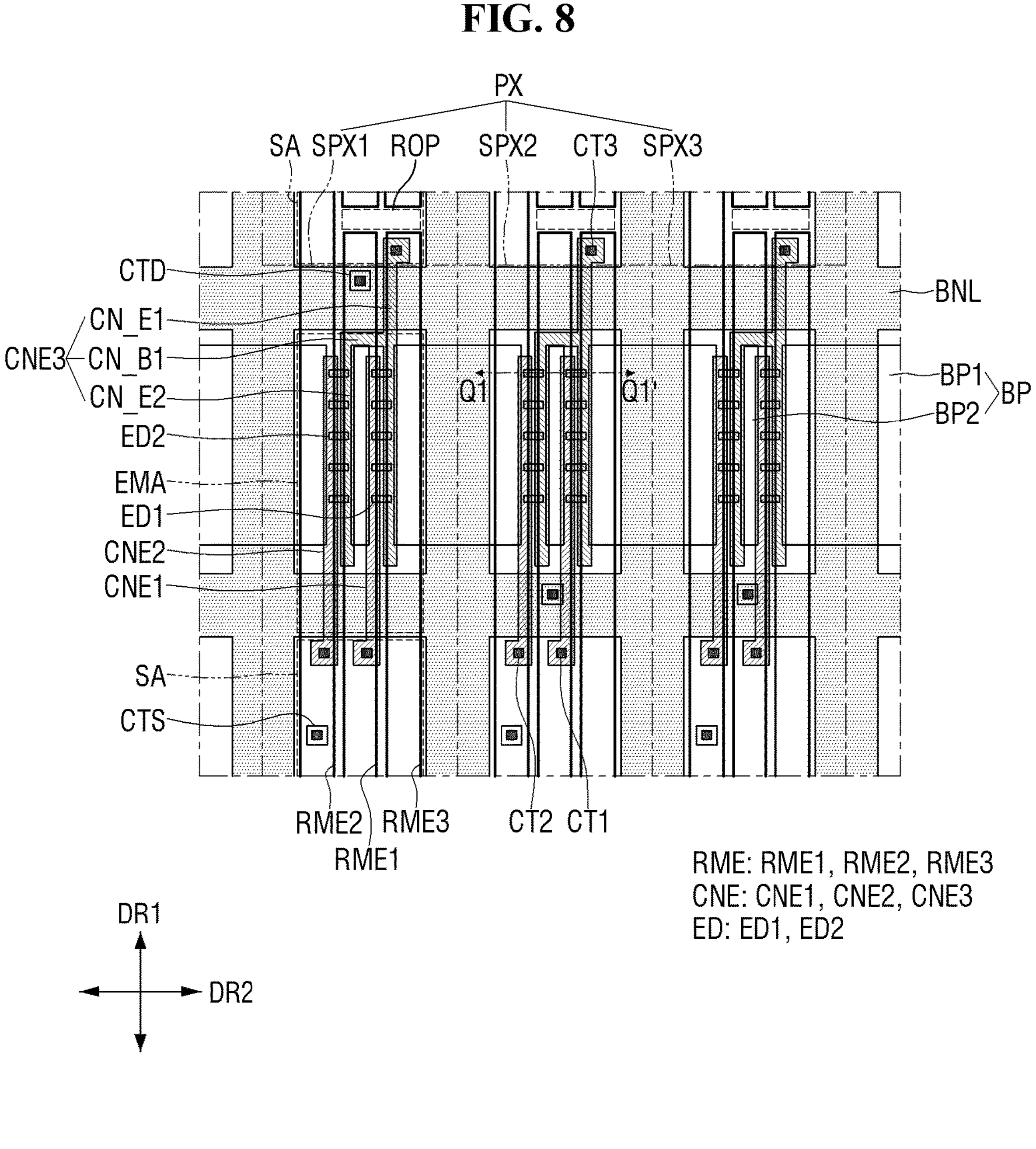
FIG. 8 is a schematic plan view illustrating electrodes and a bank, which are included in a pixel of a display device according to an embodiment.
Figure 9:
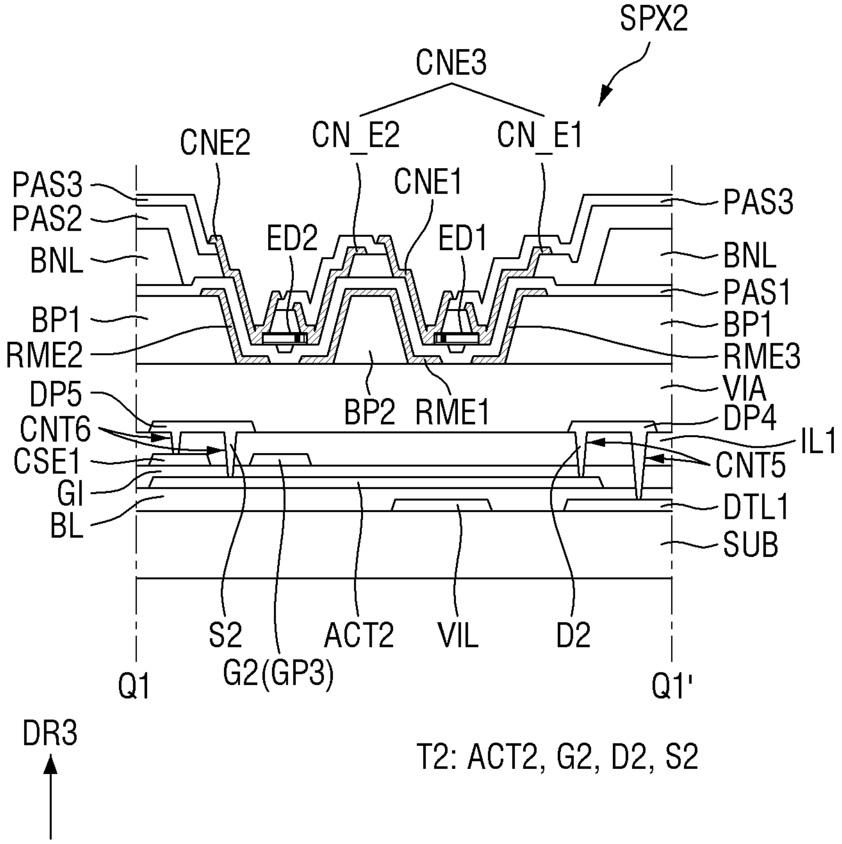
FIG. 9 is a schematic cross-sectional view taken along lines Q1-Q1' of FIG. 8.

FIG. 4 is a schematic layout view illustrating lines disposed in a pixel of a display device according to an embodiment. FIGS. 5 and 6 are schematic layout views illustrating some of lines of FIG. 4, which are partitioned. FIG. 7 is a schematic layout view illustrating an arrangement of lines and a bank of FIG. 4. FIG. 8 is a schematic plan view illustrating electrodes and a bank, which are included in a pixel of a display device according to an embodiment. FIG. 9 is a schematic cross-sectional view taken along lines Q1-Q1' of FIG. 8.

FIG. 4 is a layout view illustrating active layers ACT of a semiconductor layer and lines of a first conductive layer, a second conductive layer, and a third conductive layer as lines disposed in a pixel PX of the display device 10. FIG. 5 illustrates the first conductive layer, the semiconductor layer, and the second conductive layer. FIG. 6 illustrates only the first conductive layer, the second conductive layer, and the third conductive layer. FIG. 7 illustrates the lines of the first conductive layer, the lines of the second conductive layer, the lines of the third conductive layer, the active layer ACT of the semiconductor layer, and a bank BNL. FIG. 8 illustrates an arrangement of electrodes RME, a bank BNL, and light emitting elements ED, which are disposed on the lines. FIG. 9 illustrates a cross-section of the second transistor T2 electrically connected to a first subpixel SPX1.

Referring to FIGS. 4 to 9, the pixel PX of the display device 10 may include subpixels SPXn (n is 1 to 3). For example, each pixel PX may include a first subpixel SPX1, a second subpixel SPX2, and a third subpixel SPX3. The first subpixel SPX1 may emit light of a first color, the second subpixel SPX2 may emit light of a second color, and the third subpixel SPX3 may emit light of a third color. For example, the first color may be red, the second color may be green, and the third color may be blue, but the disclosure is not limited thereto. The respective subpixels SPXn may emit light of a same color. In an embodiment, each subpixel SPXn may emit blue light. Also, although each pixel PX includes three subpixels SPXn in FIG. 8, the pixel PX may include a larger number of subpixels SPXn.

Each subpixel SPXn of the display device 10 may include a light emission area EMA and a non-light emission area. The light emission area EMA may be an area in which a light emitting element ED emits light of a wavelength band (e.g., a specific or selectable wavelength band). The non-light emission area may be an area in which the light emitting element ED is not disposed and light emitted from the light emitting element ED does not reach the non-light emission area. Thus, light may not be emitted from the non-light emission area.

The light emission area EMA may include an area (e.g., an area of the light emitting element ED) in which the light emitting element ED is disposed, and may include an area (e.g., an area of light emission) from which the light emitted from the light emitting element ED is emitted to an area adjacent to the light emitting element ED, but the disclosure is not limited thereto. The light emission area EMA may also include an area (e.g., an area of light reflection or light refraction) in which the light emitted from the light emitting element ED is emitted by being reflected or refracted by another member. The light emitting elements ED may be disposed in the respective subpixels SPXn, and may include an area (e.g., an area of the light emitting elements ED) in which the light emitting elements ED are disposed and an area (e.g., an area of light emission, light reflection, and/or light refraction) adjacent thereto. Thus, multiple light emission areas EMA may be formed.

Although the light emission areas EMA of each subpixel SPXn are illustrated as having a uniform area, the disclosure is not limited thereto. In some embodiments, the respective light emission areas EMA of each subpixel SPXn may have different areas depending on a color or wavelength of light emitted from the light emitting element ED disposed in the corresponding subpixel SPXn.

Each subpixel SPXn may further include a sub-area SA disposed in the non-light emission area. The sub-area SA may be disposed at a lower side (e.g., another side or an opposite side) of the light emission area EMA in the first direction DR1, and may be disposed between the light emission areas EMA of the subpixels SPXn adjacent to each other in the first direction DR1. The light emission areas EMA and the sub-areas SA may be repeatedly arranged in the second direction DR2, and the light emission area EMA and the sub-area SA may be alternately arranged in the first direction DR1, but the disclosure is not limited thereto. The light emission areas EMA and the sub-areas SA in the pixels PX may have an arrangement different from that of FIG. 8. Since the light emitting element ED is not disposed in the sub-area SA, light may not be emitted from the sub-area SA, and a portion of the electrodes RME disposed in the respective subpixels SPXn may be disposed in the sub-area SA. The electrodes RME disposed in different subpixels SPXn may be spaced apart from each other by a partition portion ROP of the sub-area SA.

A bank BNL may be disposed between the light emission areas EMA and the sub-areas SA. The bank BNL may include a portion extended in the first direction DR1 and a portion extended in the second direction DR2 in a plan view, and may be disposed on a front surface of the display area DPA in a lattice pattern. The bank BNL may be disposed over a boundary of the respective subpixels SPXn and partition (e.g., define or surround) adjacent subpixels SPXn. In other embodiments, the bank BNL may be adjacent to (e.g., surround) the light emission area EMA of each subpixel SPXn. Thus, the bank BNL may partition (e.g., define or surround) the light emission areas EMA. Intervals (or distances) between the light emission areas EMA, intervals (or distances) between the sub-areas SA, and intervals (or distances) between the light emission area EMA and the sub-area SA may vary depending on a width of the bank BNL.

Lines and circuit elements of a circuit layer, which are disposed in each pixel PX and electrically connected to the light emitting element ED, may be electrically connected to the first to third subpixels SPX1, SPX2, and SPX3, respectively. However, the lines and the circuit elements may be disposed regardless of the position of the light emission area EMA in the pixel PX without being disposed to correspond to an area occupied by each subpixel SPXn or the light emission area EMA.

In one pixel PX, the circuit layer electrically connected to the first to third subpixels SPX1, SPX2, and SPX3 may be disposed in a pattern (e.g., specific or selectable pattern), and the patterns may be repeatedly arranged in units of one pixel PX rather than in each the subpixel SPXn. The subpixels PX disposed in one pixel PX may be partitioned based on the light emission area EMA and the sub-area SA, and the circuit layer electrically connected to the subpixels SPXn may be disposed regardless of the area of the subpixels SPXn. In the display device 10, an area occupied by lines and elements of the circuit layer, which are connected to each of the subpixels SPXn, may be minimized as the lines and the elements are disposed based on the unit pixel PX rather than the subpixel SPXn, and may be more advantageous in implementing high resolution.

Detailed description of layers disposed in the pixel PX of the display device 10 is provided below. The display device 10 may include a substrate SUB, a semiconductor layer, conductive layers, and insulating layers. The semiconductor layer, the conductive layers, and the insulating layers may be disposed on the substrate SUB. Each of the semiconductor layer, the conductive layer, and the insulating layers may constitute a circuit layer and a display element layer of the display device 10.

The substrate SUB may be an insulating substrate. The substrate SUB may be made of an insulating material such as glass, quartz, or a polymer resin. The substrate SUB may be a rigid substrate, but may be a flexible substrate capable of being subjected to bending, folding, rolling, or the like.

The first conductive layer may be disposed on the substrate SUB. The first conductive layer may include a first scan line SL1, a second scan line SL2, data lines DTL (a first data line DTL1, a second data line DTL2, and a third data line DTL3), a first voltage line VL1, a second voltage line VL2, an initialization voltage line VIL, and lower metal layers CAS1, CAS2, and CAS3, which are extended in the first direction DR1.

The scan lines SL may be extended in the first direction DR1. The first scan line SL1 and the second scan line SL2 may be disposed in each pixel PX, and each of the scan lines SL1 and SL2 may be disposed over the pixels PX arranged in the first direction DR1. For example, each of the scan lines SL1 and SL2 may be disposed over the pixels PX in a same row. The first scan line SL1 and the second scan line SL2 may be spaced apart from each other in the second direction DR2 and adjacent to each other. One of the first scan line SL1 and the second scan line SL2 may be electrically connected to one pixel PX, and the scan line (or the one of the first scan line SL1 and the second scan line SL2) electrically connected to the pixel PX may be electrically connected to the first to third subpixels SPX1, SPX2, and SPX3, respectively. The scan lines SL1 and SL2 may be electrically connected to the second transistor T2 (e.g., refer to FIG. 4) and the third transistor T3 (e.g., refer to FIG. 4) through a conductive pattern disposed on another conductive layer to apply a scan signal to the second transistor T2 and the third transistor T3.

As described above, the first scan line SL1 and the second scan line SL2 may be disposed at a position (e.g., a specific or selectable position) within one pixel PX without being disposed to correspond to the areas occupied by the first to third subpixels SPX1, SPX2, and SPX3, respectively. For example, the first scan line SL1 and the second scan line SL2 may not overlap each of the first to third subpixels SPX1, XPX2, and XPX3 in a plan view. In an embodiment, the first scan line SL1 and the second scan line SL2 may be disposed on a left side (e.g., another side or an opposite side) of the pixel PX in the second direction DR2, with respect to the center of the pixel PX, and may be disposed in the area occupied by the first subpixel SPX1 in a plan view.

The subpixels SPXn included in the pixel PX may be portioned depending on an arrangement of the scan lines SL1 and SL2. For example, the first subpixel SPX1 may be a subpixel adjacent to the scan lines SL1 and SL2, and the second subpixel SPX2 and the third subpixel SPX3 may not be such a subpixel. For example, the first subpixel SPX1 may be adjacent to the scan lines SL1 and SL2, and the second subpixel SPX2 and the third subpixel SPX3 may not be adjacent to (or may be spaced apart from) the scan lines SL1 and SL2. The lines electrically connected to each of the subpixels SPXn may be disposed in a pattern (e.g., a specific or selectable pattern) using one pixel PX as a repeated unit regardless of the area occupied by each subpixel SPXn. For example, the first to third subpixels SPX1, SPX2, and SPX3 of the pixel PX and first to third subpixels SPX1, SPX2, and SPX3 of adjacent pixel PX may have a same pattern. Thus, the subpixels SPXn of the pixel PX may have different patterns of lower conductive layers. For example, the first subpixel SPX1 may have a different pattern of the lower conductive layer from those of the second and third subpixels SPX2 and SPX3. As described below, when conductive layers having different patterns are disposed in each subpixel SPXn, step differences due to the conductive layers of the subpixels SPXn may be different from each other. Thus, critical dimensions (CD) of layers formed thereon may be different from each other. In the display device 10 according to an embodiment of the disclosure, step differences formed by the lower conductive layers disposed in the area occupied by each subpixel SPXn may be similarly formed. Thus, critical dimensions of layers formed thereon (e.g., critical dimensions of patterns of second insulating layers PAS2) may be prevented from being differently formed. Detailed description thereof is provided below.

The data lines DTL1, DTL2, and DTL3 may be extended in the first direction DR1. The first data line DTL1, the second data line DTL2, and the third data line DTL3 may be disposed in the pixel PX, and each of the data lines DTL1, DTL2, and DTL3 may be disposed over the pixels PX arranged in the first direction DR1. The first data line DTL1, the second data line DTL2, and the third data line DTL3 may be disposed to be spaced apart from one another in the second direction DR2. In other embodiments, the first data line DTL1, the second data line DTL2, and the third data line DTL3 may be disposed to be adjacent to one another. The first data line DTL1, the second data line DTL2, and the third data line DTL3 may be sequentially arranged in the second direction DR2, and may be electrically connected to the first subpixel SPX1, the second subpixel SPX2, and the third subpixel SPX3, respectively. The respective data lines DTL1, DTL2, and DTL3 may be electrically connected to the second transistor T2 (e.g., refer to FIG. 4) through conductive patterns disposed on different conductive layers and apply a data signal to the second transistor T2.

As described above, the first to third data lines DTL1, DTL2, and DTL3 may be disposed in a position (e.g., a specific or selectable position) within the pixel PX without corresponding to the areas occupied by the first to third subpixels SPX1, SPX2, and SPX3, respectively. For example, the first to third data lines DTL1, DTL2, and DTL3 may not overlap each of the first to third subpixels SPX1, XPX2, and XPX3 in a plan view. Although the first to third data lines DTL1, DTL2, and DTL3 are illustrated as being disposed in the third subpixel SPX3 within the pixel PX, but the disclosure is not limited thereto.

The initialization voltage line VIL may be extended in the first direction DR1 and disposed over the pixels PX arranged in the first direction DR1. The initialization voltage line VIL may be a left side of the first data line DTL1 in a plan view, and may be disposed between the lower metal layer CAS1, CAS2, and CAS3 and the first data line DTL1, but the disclosure is not limited thereto. The initialization voltage line VIL may be electrically connected to conductive patterns disposed on different conductive layers and electrically connected to each of the subpixels SPXn. The initialization voltage line VIL may be electrically connected to the drain electrode of the third transistor T3 (e.g., refer to FIG. 3), and may apply an initialization voltage to the third transistor T3.

The first voltage line VL1 and the second voltage line VL2 may be disposed to be extended in the first direction DR1, and each of the first voltage line VL1 and the second voltage line VL2 may be disposed over the pixels PX arranged in the first direction DR1. The first voltage line VL1 may be disposed between the second scan line SL2 and the lower metal layers CAS1, CAS2, and CAS3. The second voltage line VL2 may be disposed on a left side (e.g., another side or an opposite side) of the second scan line SL2 in the second direction DR2. Each of the first voltage line VL1 and the second voltage line VL2 may be electrically connected to the subpixels SPXn of the pixel PX, respectively. The first voltage line VL1 may be electrically connected to a first electrode RME1 of each subpixel SPXn through the first transistor T1 (e.g., refer to FIG. 4), and the second voltage line VL2 may be electrically connected to a second electrode RME2 through the third voltage line VL3 disposed in another conductive layer. Each of the first voltage line VL1 and the second voltage line VL2 may transmit the power voltage applied from the voltage line pads WPD_VL1 and WPD_VL2 to the electrodes RME1 and RME2 disposed in each subpixel SPXn. A high potential voltage (or first power voltage) transferred to the first electrode RME1 may be applied to the first voltage line VL1, and a low potential voltage (or second power voltage) transferred to the second electrode RME2 may be applied to the second voltage line VL2.

The lower metal layers CAS1, CAS2, and CAS3 may be disposed between the first voltage line VL1 and the initialization voltage line VIL. The lower metal layers CAS1, CAS2, and CAS3 may be disposed to overlap a first active layer ACT1 of the semiconductor layer and a first capacitance electrode CSE1 of the second conductive layer, respectively, in a plan view. The first lower metal layer CAS1 may be disposed to overlap the first active layer ACT1 of the first transistor T1_1 electrically connected to the first subpixel SPX1 in a plan view. The second lower metal layer CAS2 may be disposed to overlap the first active layer ACT1 of a first transistor T1_2 electrically connected to the second subpixel SPX2 in a plan view, and the third lower metal layer CAS3 may be disposed to overlap the first active layer ACT1 of a first transistor T1_3 electrically connected to the third subpixel SPX3 in a plan view. The first to third lower metal layers CAS1, CAS2, and CAS3 may be spaced apart from one another in the first direction DR1, and may be disposed at the center of each of the pixels PX in a plan view. For example, the first lower metal layer CAS1 may be disposed on an upper side of the pixel PX in the first direction DR1 with respect to the center of the pixel PX. The second lower metal layer CAS2 may be disposed on a lower side of the pixel PX in the first direction DR1 with respect to the center of the pixel PX. The third lower metal layer CAS3 may be disposed between the first lower metal layer CAS1 and the second lower metal layer CAS2.

The lower metal layers CAS1, CAS2, and CAS3 may include a material for shielding light and prevent light from being incident on the first active layer ACT1 of the first transistor T1. For example, the lower metal layer CAS1, CAS2, and CAS3 may be formed of an opaque metal material for blocking transmission of light, but the disclosure is not limited thereto. In some embodiments, the lower metal layers CAS1, CAS2, and CAS3 may be omitted. In other embodiments, the lower metal layers CAS1, CAS2, and CAS3 may be disposed to overlap the active layer of other transistors T1, T2, and T3 in a plan view.

The buffer layer BL may be disposed on the first conductive layer and the substrate SUB. The buffer layer BL may be formed on the substrate SUB. The buffer layer BL may protect the transistors of the pixel PX, which is vulnerable to moisture permeation, from water permeated through the substrate SUB and planarize a surface thereof.

The semiconductor layer may be disposed on the buffer layer BL. The semiconductor layer may include active layers ACT1, ACT2, and ACT3 of the transistors T1, T2, and T3.

The semiconductor layer may include at least one of polycrystalline silicon, monocrystalline silicon, and an oxide semiconductor. However, the disclosure is not limited thereto. In another embodiment, the semiconductor layer may include polycrystalline silicon. The oxide semiconductor of the semiconductor layer may be an oxide semiconductor containing indium (In). For example, the oxide semiconductor may be at least one of Indium Tin Oxide (ITO), Indium Zinc Oxide (IZO), Indium Gallium Oxide (IGO), Indium Zinc Tin Oxide (IZTO), Indium Gallium Tin Oxide (IGTO), Indium Gallium Zinc Oxide (IGZO), and Indium Gallium Zinc Tin Oxide (IGZTO).

The first active layers ACT1 of the first transistors T1_1, T1_2, and T1_3 electrically connected to each of the subpixels SPX1, SPX2, and SPX3 may be disposed on the left side of the pixel PX with respect to the center of each pixel PX. The first active layers ACT1 may be generally disposed in the area occupied by the second subpixel SPX2 or in an area between the first subpixel SPX1 and the second subpixel SPX2. The first active layers ACT1 maybe disposed to be spaced apart from each other in the first direction DR1. Portions of the first active layers ACT1 may be disposed to overlap the lower metal layers CAS1, CAS2, and CAS3 of the first conductive layer, the first capacitance electrode CSE1 of the second conductive layer, a third conductive pattern DP3 of the third conductive layer, and a second capacitance electrode CSE2 of the third conductive layer in a plan view. For example, each first active layer ACT1 may include a first area overlapping the third conductive pattern DP3 in a plan view, a second area overlapping the first capacitance electrode CSE1 in a plan view, and a third area that is a portion other than the first area and the second area and overlaps the second capacitance electrode CSE2 in a plan view.

The second active layers ACT2 of the second transistors T2_1, T2_2, and T2_3 electrically connected to each of the subpixels SPX1, SPX2, and SPX3 may be disposed to be adjacent to the center of each pixel PX. The second active layer ACT2 may be generally disposed in the area occupied by the second subpixel SPX2. The second active layers ACT2 may be disposed to be spaced apart from each other in the first direction DR1. Portions of the second active layers ACT2 may be disposed to overlap a third gate pattern GP3 of the second conductive layer and fourth and fifth conductive patterns DP4 and DP5 of the third conductive layer in a plan view. For example, the second active layer ACT2 may include a first area overlapping the fourth conductive pattern DP4 in a plan view, a second area overlapping the third gate pattern GP3 in a plan view, and a third area that is a portion other than the first area and the second area and overlaps the fifth conductive pattern DP5 in a plan view. The first area of the second active layer ACT2 may be in contact with the fourth conductive pattern DP4, and the third area of the second active layer ACT2 may be in contact with the fifth conductive pattern DP5.

The second active layer ACT2 of the second transistors T2 may have different lengths depending on the arrangement of the data lines DTL1, DTL2, and DTL3. For example, the first data line DTL1, the second data line DTL2, and the third data line DTL3 may be sequentially disposed in the second direction DR2 from the area in which the second active layers ACT2 are disposed. The first data line DTL1 may be adjacent to the second active layer ACT2, and the second active layer ACT2 of the second transistor T2_1 electrically connected to the first subpixel SPX1 may have the shortest length measured in the second direction DR2. The third data line DTL3 may be most spaced apart from the second active layer ACT3, and the second active layer ACT3 of the third transistor T2_3 electrically connected to the third subpixel SPX3 may have the longest length measured in the second direction DR2. However, an order relationship in the length of the second active layers ACT2 may vary depending on the arrangement of the subpixels SPXn and the arrangement of the data lines DTL.

The third active layers ACT3 of the third transistors T3_1, T3_2, and T3_3 electrically connected to each of the subpixels SPX1, SPX2, and SPX3 may be also disposed at the center of the pixel PX. The third active layers ACT3 may be also disposed in the area occupied by the second subpixel SPX3. The third active layers ACT3 may be spaced apart from each other in the first direction DR1, and may be disposed in parallel with the second active layers ACT2 in the first direction DR1. Portions of the third active layers ACT3 may be disposed to overlap the third gate pattern GP3 of the second conductive layer, a sixth conductive pattern DP6, and the second capacitance electrode CSE2 of the third conductive layer in a plan view. For example, the third active layer ACT3 may include a first area overlapping the sixth conductive pattern DP6 in a plan view, a second area overlapping the third gate pattern GP3 in a plan view, and a third area that is a portion other than the first area and the second area and overlaps the second capacitance electrode CSE2 in a plan view. The first area of the third active layer ACT3 may be in contact with the sixth conductive pattern DP6, and the third area of the third active layer ACT3 may be in contact with the second capacitance electrode CSE2.

A first gate insulating layer GI may be disposed on the semiconductor layer and the buffer layer BL. The first gate insulating layer GI may serve as a gate insulating layer of the first transistor T1.

The second conductive layer may be disposed on the first gate insulating layer GI. The second conductive layer may include gate patterns GP1, GP2, GP3, GP4, GP5 and GP6, and a first capacitance electrode CSE1.

The first gate pattern GP1 and the second gate pattern GP2 may have a shape extending in the first direction DR1, and may be disposed on the left side of each pixel PX. The first gate pattern GP1 and the second gate pattern GP2 may be disposed to overlap the first scan line SL1 and the second scan line SL2, respectively, in a plan view. The first gate pattern GP1 may be electrically connected (e.g., directly connected) to the first scan line SL1 through an eleventh contact hole CNT11 that passes through the buffer layer BL and the first gate insulating layer GI. The second gate pattern GP2 may be electrically connected (e.g., directly connected) to the second scan line SL2 through the eleventh contact hole CNT11 that passes through the buffer layer BL and the first gate insulating layer GI. The first gate pattern GP1 and the second gate pattern GP2 may prevent intensity of the scan signal applied from the pad area PDA through the first scan line SL1 and the second scan line SL2 from being lowered in accordance with the position of the display area DPA. For example, the first gate pattern GP1 and the second gate pattern GP2 may prevent attenuation of the scan signal.

The third gate pattern GP3 may have a shape extending in the first direction DR1 and may be disposed at the center of each pixel PX. The third gate pattern GP3 may be extended from the lower side of the pixel PX in the first direction DR1 and overlap the second active layers ACT2 and the third active layer ACT3 in a plan view. For example, the third gate pattern GP3 may overlap the second area of the second active layers ACT2 and the second area of the third active layers ACT3 in a plan view. The third gate pattern GP3 may serve as a second gate electrode G2 of the second transistor T2 and a third gate electrode G3 of the third transistor T3. The third gate pattern GP3 may be electrically connected to the first scan line SL1 or the second scan line SL2 through the third scan line SL3. The scan signal may be transferred to the second transistor T2 and the third transistor T3 through the third gate pattern GP3.

Each of the fourth gate pattern GP4, the fifth gate pattern GP5, and the sixth gate pattern GP6 may electrically connect the second capacitance electrode CSE2 with the first electrode RME1 of each subpixel SPXn. The fourth gate pattern GP4 may be disposed in the second subpixel SPX2, and may be disposed on the upper side of each pixel PX. The fourth gate pattern GP4 may be electrically connected to the first electrode RME1 of the first subpixel SPX1. The fifth gate pattern GP5 may be disposed in the second subpixel SPX2, and may be disposed on the lower side of each pixel PX. The fifth gate pattern GP5 may be electrically connected to the first electrode RME1 of the second subpixel SPX2. The sixth gate pattern GP6 may be disposed in the third subpixel SPX3, and may be disposed on a right upper side of each pixel PX. The sixth gate pattern GP6 may be electrically connected to the first electrode RME3 of the third subpixel SPX3.

The first capacitance electrodes CSE1 may be spaced apart from each other in the second direction DR2 and disposed between the second gate pattern GP2 and the third gate pattern GP3. A portion of the first capacitance electrodes CSE1 may overlap the lower metal layer CAS1, CAS2, and CAS3, the first active layer ACT1, and the second capacitance electrode CSE2 of the third conductive layer in a plan view. For example, a portion of the first capacitance electrodes CSE1 may overlap the second area of the first active layer ACT1 in a plan view, and may serve as the first gate electrode G1 of the first transistor T1. The first capacitance electrode CSE1 may be electrically connected to the fourth conductive pattern DP4, and may transfer the data signal applied through the second transistor T2 to the first gate electrode G1 of the first transistor T1. The first capacitance electrode CSE1 may overlap the second capacitance electrode CSE2 in a plan view to constitute a storage capacitor Cst.

A first interlayer insulating layer IL1 may be disposed on the second conductive layer. The first interlayer insulating layer IL1 may serve as an insulating layer between the second conductive layer and other layers disposed on the second conductive layer. The first interlayer insulating layer IL1 may protect the second conductive layer.

The third conductive layer may be disposed on the first interlayer insulating layer ILL The third conductive layer may include a third scan line SL3, a third voltage line VL3, and conductive patterns DP1, DP2, DP3, DP4, DP5 and DP6.

The third scan line SL3 may be extended in the second direction DR2 and disposed over the pixels PX arranged in the second direction DR2. The third scan line SL3 may be disposed on the lower side of each pixel PX in a plan view, and may be disposed across the non-light emission area of each of the subpixels SPXn. The third scan line SL3 may be electrically connected to the first scan line SL1 or the second scan line SL2 of the first conductive layer. The third scan line SL3 may be electrically connected to the first scan line SL1 or the second scan line SL2 through a contact hole that passes through the buffer layer BL, the first gate insulating layer GI, and the first interlayer insulating layer IL1.

The third scan line SL3 may be electrically connected to any one of the first scan line SL1 and the second scan line SL2 disposed in any one pixel PX. For example, when the third scan line SL3 is electrically connected to the first scan line SL1 disposed in the pixel PX (e.g., a corresponding pixel PX), the third scan line SL3 may not be electrically connected to another second scan line SL2 disposed in a same row as the corresponding pixel PX. Another third scan line SL3 spaced apart from the corresponding third scan line SL3 in the first direction DR1 may be electrically connected to another scan lines SL1 and SL2 except the first scan line SL1 disposed in the pixel PX (e.g., the corresponding pixel PX).

The third scan line SL3 may be electrically connected to the third gate pattern GP3 of the second conductive layer, and may be electrically connected to the second transistor T2 and the third transistor T3. The third scan line SL3 may be electrically connected to the third gate pattern GP3 through a tenth contact hole CNT10 that passes through the first interlayer insulating layer ILL The third scan line SL3 may be electrically connected to the third gate pattern GP3 disposed in the pixels PX of the same row. The third scan line SL3 may transfer the scan signal to the gate electrode (e.g., the second gate electrode G2 or the third gate electrode G3) of each of the second transistor T2 and the third transistor T3 through the first scan line SL1 or the second scan line SL2 and the third gate pattern GP3.

The third voltage line VL3 may be extended in the second direction DR2 and disposed over the pixels PX arranged in the second direction DR2. The third voltage line VL3 may be disposed on the upper side of each pixel PX in a plan view, and may be disposed across the non-light emission area of each of the subpixels SPXn. According to an embodiment, the third voltage line VL3 may be electrically connected to any one of the first voltage line VL1 and the second voltage line VL2. The third voltage lines VL3 may be spaced apart from each other in the first direction DR1. Among the third voltage lines, the line electrically connected to the first voltage line VL1 and the line electrically connected to the second voltage line VL2 may be alternately disposed.

For example, when the third voltage line VL3 disposed in the pixels PX of any pixel row is electrically connected to the first voltage line VL1 as shown, the third voltage line VL3 of pixel rows adjacent to the above pixel row in the first direction DR1 may be electrically connected to the second voltage line VL2. In the pixel row in which the first voltage line VL1 and the third voltage line VL3 are electrically connected to each other, the third voltage line VL3 may be electrically connected to the first voltage line VL1 through a thirteenth contact hole CNT13 that passes through the buffer layer BL, the first gate insulating layer GI, and the first interlayer insulating layer IL1 at a portion overlapping the first voltage line VL1 in a plan view. The third voltage line VL3 may be electrically connected to the third conductive pattern DP3. For example, the third voltage line VL3 and the third conductive pattern DP3 may be integral with each other, and the third voltage line VL3 may be electrically connected to the first voltage line VL1 through the third conductive pattern DP3. In the pixel row in which the second voltage line VL2 and the third voltage line VL3 are electrically connected to each other, the third voltage line VL3 may be spaced apart from the third conductive pattern DP3 of the third conductive layer.

The voltage lines VL (e.g., the first voltage line VL1, the second voltage line VL2, and the third voltage line VL3) may be extended from the front surface of the display area DPA in the first direction DR1 and the second direction DR2 and disposed in a mesh structure. The first voltage line VL1 and the second voltage line VL2 may be made of the first conductive layer. The first voltage line VL1 and the second voltage line VL2 may be extended in the first direction DR1 and disposed in each pixel PX. The third voltage line VL3 may be made of the third conductive layer, and may be extended in the second direction DR2 and disposed in the pixels PX of different rows. Thus, the third voltage line VL3 may be disposed on the front surface of the display area DPA in a mesh shape.

The pixel rows may be distinguished from each other depending on whether the third voltage line VL3 is connected to the first voltage line VL1 or the second voltage line VL2. For example, the pixel rows may be distinguished from each other depending on an electrical connection between the third voltage line VL3 and the first voltage line VL1 or an electrical connection between the third voltage line VL1 and the second voltage line VL2. The voltage lines VL may be electrically connected to multiple pixels PX (e.g., all of the pixels PX) in accordance with the electrical connection of the first voltage line VL1 and the second voltage line VL2 even though the third voltage line VL3 is alternately disposed in a tile-type line in accordance with the electrical connection with another voltage lines VL1 and VL2. Therefore, the number of lines disposed in the display area DPA may be further reduced, and voltage drop of the voltage applied through the voltage line may be avoided (or prevented) in the large-sized display device. The arrangement and connection of the voltage lines VL (e.g., the first voltage line VL1, the second voltage line VL2, and the third voltage line VL3) is described below with reference to other drawings.

The second capacitance electrodes CSE2 may be spaced apart from each other in the first direction DR1 and overlap the first capacitance electrode CSE1 and the lower metal layers CAS1, CAS2, and CAS3 in a plan view. The second capacitance electrode CSE2 may be spaced apart from the first capacitance electrode CSE1 with the first interlayer insulating layer IL1 disposed therebetween. The storage capacitor Cst may be formed between the second capacitance electrode CSE2 and the first capacitance electrode CSE1. A second capacitance electrode CSE2 disposed on the upper side of the pixel PX among the second capacitance electrodes CSE2 may form a storage capacitor Cst of the first subpixel SPX1. A second capacitance electrode CSE2 disposed at the lower side of the pixel PX may form a storage capacitor Cst of the second subpixel SPX2. A second capacitance electrode CSE2 disposed at the center of the pixel PX may form a storage capacitor Cst of the third subpixel SPX3.

A portion of the second capacitance electrode CSE2 may overlap the first active layer ACT1 and the third active layer ACT3 in a plan view. Each second capacitance electrode CSE2 may be electrically connected to the first active layer ACT1 at a portion (e.g., an overlapping portion), at which the second capacitance electrode CSE2 overlaps the first active layer ACT1 in a plan view, through a second contact hole CNT2 that passes through the first gate insulating layer GI and the first interlayer insulating layer ILL and may serve as a first source electrode Si of the first transistor T1. The second capacitance electrode CSE2 may be electrically connected to the lower metal layers CAS1, CAS2, and CAS3 through a fourth contact hole CNT4 that passes through the buffer layer BL, the first gate insulating layer GI, and the first interlayer insulating layer ILL The second capacitance electrode CSE2 may be electrically connected to the third active layer ACT3 at a portion (e.g., an overlapping portion), at which the second capacitance electrode CSE2 overlaps the third active layer ACT3 in a plan view, through an eighth contact hole CNT8 that passes through the first gate insulating layer GI and the first interlayer insulating layer ILI, and may serve as a third source electrode S3 of the third transistor T3.

The second capacitance electrode CSE2 may be electrically connected to the first electrode RME1 disposed on a via layer VIA. Detailed description of the via layer VIA is provided below. The second capacitance electrodes CSE2, which form the storage capacitor Cst of the first subpixel SPX1, the second subpixel SPX2, and the third subpixel SPX3, may be electrically connected to the first electrode RME1 of the subpixel SPXn through the fourth gate pattern GP4, the fifth gate pattern GP5, and the sixth gate pattern GP6, respectively.

The first conductive pattern DP1 and the second conductive pattern DP2 may have a shape extending in the first direction DR1, and may be disposed on the left side of each pixel PX. The first conductive pattern DP1 may be disposed to overlap the first scan line SL1 and the first gate pattern GP1 in a plan view. The second conductive pattern DP2 may be disposed to overlap the second scan line SL2 and the second gate pattern GP2 in a plan view. The first conductive pattern DP1 may be electrically connected (e.g., directly connected) to the first scan line SL1 through a twelfth contact hole CNT12 that passes through the buffer layer BL and the first gate insulating layer GI. The second conductive pattern DP2 may be electrically connected (e.g., directly connected) to the second scan line SL2 through the twelfth contact hole CNT12 that passes through the buffer layer BL and the first gate insulating layer GI.

The third conductive pattern DP3 may have a shape extending in the first direction DR1, and may be disposed between the second conductive pattern DP2 and the second capacitance electrodes CSE2. The third conductive pattern DP3 may partially overlap the first voltage line VL1 and the first active layer ACT1 in a plan view, and may be electrically connected to the first voltage line VL1 and the first active layer ACT1, respectively. The third conductive pattern DP3 may be in contact with the first voltage line VL1 through a third contact hole CNT3 that passes through the buffer layer BL, the first gate insulating layer GI, and the first interlayer insulating layer ILI. The third conductive pattern DP3 may be in contact with the first active layer ACT1 through a first contact hole CNT1 that passes through the first gate insulating layer GI and the first interlayer insulating layer ILL The third conductive pattern DP3 may serve as the first drain electrode D1 of the first transistor T1. Also, as described above, the third conductive pattern DP3 may be electrically connected to the third voltage line VL3. In other embodiments, the third conductive pattern DP3 may be spaced apart from the third voltage line VL3.

The fourth conductive patterns DP4 may be disposed to overlap one of the second active layer ACT2 and the data lines DTL in a plan view. The fifth conductive patterns DP5 may be disposed to overlap the second active layer ACT2 and the first capacitance electrode CSE1 in a plan view. The fourth conductive patterns DP4 may be in contact with the data line DTL through a fifth contact hole CNT5 that passes through the buffer layer BL, the first gate insulating layer GI, and the first interlayer insulating layer ILL and may be in contact with the second active layer ACT2 through a fifth contact hole CNT5 that passes through the first gate insulating layer GI and the first interlayer insulating layer IL 1. The fourth conductive pattern DP4 may serve as a second drain electrode D2 of the second transistor T2. The fifth conductive patterns DP5 may be in contact with the first capacitance electrode CSE1 through a sixth contact hole CNT6 that passes through the first interlayer insulating layer ILL and may be in contact with the second active layer ACT2 through a sixth contact hole CNT6 that passes through the first gate insulating layer GI and the first interlayer insulating layer ILI. The fifth conductive pattern DP5 may serve as a second source electrode S2 of the second transistor T2.

The sixth conductive patterns DP6 may be disposed to overlap the initialization voltage line VIL and the third active layer ACT3 in a plan view. The sixth conductive patterns DP6 may be in contact with the initialization voltage line VIL through a seventh contact hole CNT7 that passes through the buffer layer BL, the first gate insulating layer GI, and the first interlayer insulating layer 11,1, and may be in contact with the third active layer ACT3 through a seventh contact hole CNT7 that passes through the first gate insulating layer GI and the first interlayer insulating layer ILL The sixth conductive pattern DP6 may serve as a third drain electrode D3 of the third transistor T3.

The conductive layers below the via layer VIA may be made of the first to third conductive layers, but the disclosure is not limited thereto. In some embodiments, the display device 10 may further include a fourth conductive layer disposed between the third conductive layer and the via layer VIA, and the fourth conductive layer may include several conductive patterns.

The buffer layer BL, the first gate insulating layer GI, and the first interlayer insulating layer IL1 may be formed of inorganic layers that are alternately stacked each other. For example, the buffer layer BL, the first gate insulating layer GI, and the first interlayer insulating layer IL1 may be formed of a double layer, in which inorganic layers including at least one of silicon oxide ($SiO_x$), silicon nitride ($SiN_x$), and silicon oxynitride ($SiO_xN_y$) are stacked each other, or multiple layers in which the inorganic layers are alternately stacked each another, but the disclosure is not limited thereto. The buffer layer BL, the first gate insulating layer GI, and the first interlayer insulating layer IL1 may be made of an inorganic layer including the insulating material described above. Also, in some embodiments, the first interlayer insulating layer IL1 may be made of an organic insulating material such as polyimide (PI).

The second conductive layer and the third conductive layer may be formed of a single layer or multiple layers made of at least one of molybdenum (Mo), aluminum (Al), chromium (Cr), gold (Au), titanium (Ti), nickel (Ni), neodymium (Nd), copper (Cu), and their alloy, but the disclosure is not limited thereto.

The via layer VIA may be disposed on the third conductive layer. The via layer VIA may include an organic insulating material such as polyimide (PI), and may perform a surface planarization function.

Electrodes RME (e.g., a first electrode RME1, a second electrode RME2, and a third electrode RME3), bank patterns BP (e.g., BP1 and BP2), a bank BNL, light emitting elements ED, and connection electrodes CNE (e.g., a first electrode CNE1, a second electrode CNE2, and a third electrode CNE3) may be disposed on the via layer VIA as display element layers. Insulating layers PAS1, PAS2, and PAS3 may be disposed on the via layer VIA.

The bank patterns BP may be disposed (e.g., directly disposed) on the via layer VIA. The bank patterns BP may have a shape extending in the first direction DR1 with a width (e.g., a predetermined or selectable width) in the second direction DR2. The bank patterns BP may be disposed over the light emission area EMA of different subpixels SPXn. In other embodiments, the bank patterns BP may be disposed in the light emission area EMA. For example, the bank patterns BP may include a first bank pattern BP1 disposed over the light emission area EMA of different subpixels and a second bank pattern BP2 disposed between the first bank patterns BP1 in the light emission area EMA of each subpixel SPXn.

The first bank pattern BP1 and the second bank pattern BP2 may be spaced apart from each other in the second direction DR2 in the light emission area EMA. The second bank pattern BP2 may be disposed at the center of the light emission area EMA, and the first bank patterns BP1 may be disposed to be spaced apart from each other with the second bank pattern BP2 disposed therebetween. For example, the second bank pattern BP2 may be disposed between the first bank patterns BP1. The first bank pattern BP1 and the second bank pattern BP2 may be alternately disposed in the second direction DR2. The light emitting elements ED may be disposed between the first bank patterns BP1 and the second bank pattern BP2, which are spaced apart from each other.

The first bank pattern BP1 and the second bank pattern BP2 have a same length in the first direction DR1, but their widths measured in the second direction DR2 may be different from each other. In the bank BNL, a portion extended in the first direction DR1 may overlap the first bank pattern BP1 in a thickness direction. Detailed description of the bank BNL is provided below. The bank patterns BP may be disposed in an island pattern on the front surface of the display area DPA.

The bank patterns BP may have a structure in which at least a portion is protruded based on the upper surface of the via layer VIA. The protruded portion of the bank pattern BP may have an inclined or curved side. Unlike the illustrated example, the bank pattern BP may have a semi-circular or semi-elliptical shape on an outer surface on a cross-sectional view. The bank pattern BP may include an organic insulating material such as polyimide (PI). However, the disclosure is not limited thereto.

The electrodes RME may be disposed in each subpixel SPXn in a shape extending in a direction. The electrodes RME may be extended in the first direction DR1 and disposed over the light emission area EMA and the sub-area SA of the subpixel SPXn, which may be spaced apart from each other in the second direction DR2. The display device 10 may include a first electrode RME1, a second electrode RME2, and a third electrode RME3, which are disposed in each subpixel SPXn. The first electrode RME1 may be disposed at the center of the light emission area EMA. The second electrode RME2 may be disposed on a left side of the first electrode RME1. The third electrode RME3 may be disposed on a right side of the first electrode RME1.

The first electrode RME1 may be disposed on the second bank pattern BP2. The second electrode RME2 and the third electrode RME3 may be disposed on the first bank patterns BP1 having portions different from each other. Each of the electrodes RME may be disposed on an inclined side of each of the bank patterns BP1 and BP2. The first electrode RME1 may have a width in the second direction DR2, which is greater than a width of the second bank pattern BP2. The second electrode RME2 and the third electrode RME3 may have a width in the second direction DR2, which is smaller than a width of the first bank pattern BP1. Each of the electrodes RME may be disposed to cover a side of the bank patterns BP. Thus, the light emitted from the light emitting element ED may be reflected from the electrodes RME. An interval (or a distance) between the electrodes RME in the second direction DR2 may be narrower than an interval (a distance) between the bank patterns BP1 and BP2. At least part of each of the electrodes RME may be disposed (e.g., directly disposed) on a same layer (e.g., disposed on the via layer VIA).

The first electrode RME1 and the third electrode RME3 may be extended in the first direction DR1, and may be spaced apart from the first electrode RME1 and the third electrode RME3 of another subpixel SPXn adjacent thereto in the first direction DR1 in the sub-area SA of each subpixel SPXn. On the other hand, the second electrode RME2 may be extended in the first direction DR1 and disposed in the subpixels SPXn arranged in the first direction DR1.

The first electrode RME1 may be electrically connected to the third conductive layer through a first electrode contact hole CTD formed in a portion overlapping the bank BNL in a plan view. The first electrode RME1 of the first subpixel SPX1 may be in contact with the fourth gate pattern GP4 electrically connected to the second capacitance electrode CSE2 through the first electrode contact hole CTD that passes through the via layer VIA in the portion overlapping the bank BNL positioned above the light emission area EMA in a plan view. The first electrode RME1 of the second subpixel SPX2 and the third subpixel SPX3 may be electrically connected to the third conductive layer through the first electrode contact hole CTD that passes through the via layer VIA in the portion overlapping the bank BNL positioned above the light emission area EMA in a plan view. The first electrode RME1 of the second subpixel SPX2 may be electrically connected to the fifth gate pattern GP5 electrically connected to the second capacitance electrode CSE2. The first electrode RME1 of the third subpixel SPX3 may be electrically connected to the sixth gate pattern GP6 electrically connected to the second capacitance electrode CSE2.

The second electrode RME2 may be electrically connected to the third voltage line VL3 through a second electrode contact hole CTS that passes through the via layer VIA in the sub-area SA positioned above the light emission area EMA. The third voltage line VL3 electrically connected to the second electrode RME2 may be a voltage line electrically connected to the second voltage line VL2.

The electrodes RME may be electrically connected to a portion of the light emitting elements ED. Each of the electrodes RME may be electrically connected to the light emitting element ED through connection electrodes CNE (e.g., first to third connection electrodes CNE1, CNE2, and CNE3), and may transfer an electrical signal applied from the conductive layer therebelow to the light emitting element ED. Detailed description of the connection electrodes CNE is provided below.

The first insulating layer PAS1 may be disposed on the via layer VIA, the bank patterns BP, and the electrodes RME. The first insulating layer PAS1 may be disposed on the via layer VIA and cover the electrodes RME and the bank patterns BP. The first insulating layer PAS1 may not be disposed at a portion in which the electrodes RME adjacent to each other in the first direction DR1 are spaced apart from each other in the sub-area SA. For example, the first insulating layer PAS1 may not be disposed at the portion between the electrodes RME. The first insulating layer PAS1 may protect the electrodes RME and at a same time mutually and electrically insulate the different electrodes RME. The first insulating layer PAS1 may prevent the light emitting element ED disposed thereon from being damaged by direct contact with the electrodes RME.

In an embodiment, the first insulating layer PAS1 may be stepped, and an upper surface of the first insulating layer PAS1 may be partially recessed between the electrodes RME spaced apart from each other in the second direction DR2. The light emitting elements ED may be disposed on the upper surface of the first insulating layer PAS1 that is stepped, and a space may be formed between the light emitting elements ED and the first insulating layer PAS1. The space formed between the light emitting elements ED and the first insulating layer PAS1 may be filled with the second insulating layer PAS2. Detailed description of the second insulating layer PAS2 is provided below.

The first insulating layer PAS1 may include contact portions CT1, CT2, and CT3 that expose a portion of the upper surfaces of the respective electrodes RME. The contact portions CT1, CT2, and CT3 may pass through the first insulating layer PAS. The connection electrodes CNE may be in contact with the electrode RME exposed through the contact portions CT1 and CT2, respectively. Detailed description of the connection electrodes CNE is provided below.

The bank BNL may be disposed on the first insulating layer PAS1. The bank BNL may include a portion extended in the first direction DR1 and the second direction DR2 in a plan view. The bank BNL may be disposed in a lattice pattern. The bank BNL may be disposed over a boundary of the respective subpixels SPXn and partition the subpixels SPXn adjacent to each other. The bank BNL may be disposed to surround the light emission area EMA and the sub-areas SA. An area partitioned and an area opened by the bank BNL may be the light emission area EMA and the sub-area SA, respectively.

The bank BNL may have a height (e.g., a predetermined or selectable height). In some embodiments, a height of the upper surface of the bank BNL may be greater than a height of the bank patterns BP. A thickness of the bank BNL may be equal to or greater than a thickness of the bank pattern BP. The bank BNL may prevent ink from overflowing to the subpixel SPXn adjacent thereto during an inkjet printing process of the manufacturing process of the display device 10. The bank BNL may prevent inks, in which different light emitting elements ED are dispersed for each different subpixel SPXn, from being mixed with each other. The bank BNL may include polyimide in a same manner as the bank pattern BP, but the disclosure is not limited thereto.

The light emitting elements ED may be disposed on the first insulating layer PAS1. The light emitting element ED may include layers disposed in a direction parallel with the upper surface of the substrate SUB. The light emitting elements ED of the display device 10 may be extended in a direction parallel with the substrate SUB. The semiconductor layers included in the light emitting element ED may be sequentially disposed in the direction parallel with the upper surface of the substrate SUB. However, the disclosure is not limited thereto. In some embodiments, the light emitting element ED may have another structure, and the layers may be disposed in a direction perpendicular to the substrate SUB.

The light emitting elements ED may be disposed on the electrodes RME spaced apart from each other in the second direction DR2 between the different bank patterns BP1 and BP2. The light emitting elements ED may be disposed to be spaced apart from each other in the first direction DR1, and may be aligned to be substantially parallel with each other. The light emitting element ED may have a shape extending in a direction, and the extended length of the light emitting element ED may be longer than the shortest interval (or the shortest distance) between the electrodes RME spaced apart from each other in the second direction DR2. At least one end of the light emitting elements ED may be disposed on any one of the different electrodes RME. In other embodiments, both ends of the light emitting elements ED may be disposed on the different electrodes RME. The direction in which each of the electrodes RME is extended and the direction in which the light emitting element ED is extended may be substantially perpendicular to each other, but the disclosure is not limited thereto. The light emitting element ED may be obliquely disposed in the direction in which each of the electrodes RME is extended.

The light emitting element ED may include a first light emitting element ED1 and a second light emitting element ED2. The first light emitting element ED1 may have ends (e.g., both ends) disposed on the first electrode RME1 and the third electrode RME3, and the second light emitting element ED2 may have ends (e.g., both ends) disposed on the first electrode RME1 and the second electrode RME2. The first light emitting elements ED1 may be disposed on a right side based on the first electrode RME1. The second light emitting elements ED2 may be disposed on a left side based on the first electrode RME1.

The light emitting elements ED disposed in each subpixel SPXn may include semiconductor layers and emit light of a wavelength band (e.g., a specific or selectable wavelength band). In each of the light emitting elements ED, a first end and a second end opposite to the first end may be defined based on any one semiconductor layer. For example, in the first light emitting element ED1, a portion thereof disposed on the first electrode RME1 may be the first end, and a portion thereof disposed on the third electrode RME3 may be the second end. In the second light emitting element ED2, a portion thereof disposed on the first electrode RME1 may be the first end, and a portion thereof disposed on the second electrode RME2 may be the second end. The first end of each of the first light emitting element ED1 and the second light emitting element ED2 may be disposed on the first electrode RME1, and directions toward which the first ends of the light emitting elements ED1 and ED2 are directed may be opposite to each other. However, in other embodiments, first ends of some of the first and second light emitting elements ED1 and ED2 may be directed in a same direction.

The light emitting elements ED may be in contact with the connection electrodes CNE (e.g., the first connection electrode CNE1, the second connection electrode CNE2, and the third connection electrode CNE3) and electrically connected to the electrode RME and another light emitting element ED (or other light emitting elements ED). A portion of the semiconductor layer of the light emitting element ED may be exposed on an extended one-directional end surface of the light emitting element ED, and the exposed semiconductor layer of the light emitting element ED may be in contact with the connection electrode CNE. Each of the light emitting elements ED may be electrically connected to the conductive layers below the via layer VIA and the electrode RME through the connection electrodes CNE. In case that an electrical signal is applied to each of the light emitting elements ED, the light emitting element ED may emit light of a wavelength band (e.g., a specific or selectable wavelength band).

The second insulating layer PAS2 may be disposed in the light emitting elements ED, the bank BNL, and the sub-area SA. The second insulating layer PAS2 may include a pattern portion extended in the first direction DR1 and disposed on the light emitting elements ED. The pattern portion of the second insulating layer PAS2 may partially surround an outer surface of the light emitting element ED between the first bank pattern BP1 and the second bank pattern BP2, and may not cover both sides or both ends of the light emitting element ED. The pattern portion of the second insulating layer PAS2 may form a linear or island-shaped pattern within each subpixel SPXn in a plan view. The pattern portion of the second insulating layer PAS2 may protect the light emitting element ED and simultaneously fix the light emitting elements ED in the manufacturing process of the display device 10. The second insulating layer PAS2 may be disposed to fill a space between the light emitting element ED and the first insulating layer PAS1 below the light emitting element ED.

The connection electrodes CNE (the first connection electrode CNE1, the second connection electrode CNE2, and the third connection electrode CNE3) may be disposed on the electrodes RME and the light emitting elements ED. The connection electrodes CNE may be in contact with the electrodes RME and the light emitting elements ED, respectively. For example, the connection electrode CNE may be in contact with any one end of the light emitting element ED and at least one of the electrodes RME through the contact portions CT1, CT2, and CT3 that pass through the first insulating layer PAS1.

The first connection electrode CNE1 may have a shape extending in the first direction DR1, and may be disposed on the first electrode RME1. A portion of the first connection electrode CNE1, which is disposed on the second bank pattern BP2, may overlap the first electrode RME1 in a plan view, and may be extended from the first electrode RME1 in the first direction DR1 and disposed to reach the sub-area SA positioned below the light emission area EMA beyond the bank BNL. The first connection electrode CNE1 may be in contact with the first electrode RME1 through the first contact portion CT1 that exposes the upper surface of the first electrode RME1 in the sub-area SA. The first connection electrode CNE1 may be in contact with the first end of the first light emitting elements ED1 and the first electrode RME1 and transfer an electrical signal applied from the first transistor T1 to the light emitting element ED.

The second connection electrode CNE2 may have a shape extending in the first direction DR1, and may be disposed on the second electrode RME2. A portion of the second connection electrode CNE2, which is disposed on the first bank pattern BP1, may overlap the second electrode RME2 in a plan view, and may be extended from the second electrode RME2 in the first direction DR1 and disposed to reach the sub-area SA positioned below the light emission area EMA beyond the bank BNL. The second connection electrode CNE2 may be in contact with the second electrode RME2 through the second contact portion CT2 that exposes the upper surface of the second electrode RME2 in the sub-area SA. The second connection electrode CNE2 may be in contact with the second end of the second light emitting elements ED2 and the second electrode RME2 and transfer an electrical signal applied from the second voltage line VL2 to the light emitting element ED.

The third connection electrode CNE3 may include extension portions CN_E1 and CN_E2 and a first connection portion CN_B1. The extension portions CN_E1 and CN_E2 may be extended in the first direction DR1, and the first connection portion CN B1 may electrically connect the extension portions CN_E1 and CN_E2. The first extension portion CN_E1 may be disposed on the third electrode RME3 and extended from the light emission area EMA to the sub-area SA positioned above the light emission area EMA. The second extension portion CN_E2 may be disposed on the first electrode RME1 in the light emission area EMA. The first connection portion CN_B1 may be extended from the light emission area EMA in the second direction DR2 and electrically connect the first extension portion CN_E1 with the second extension portion CN_E2. The first extension portion CN_E1 of the third connection electrode CNE3 may be in contact with the third electrode RME3 through the third contact portion CT3 that exposes the upper surface of the third electrode RME3 in the sub-area SA. The third connection electrode CNE3 may be in contact with the second end of the first light emitting elements ED1 and the first end of the second light emitting elements ED2 and electrically connect the first light emitting element ED1 with the second light emitting element ED2. The first light emitting element ED1 and the second light emitting element ED2 may be electrically connected in series through the third connection electrode CNE3.

The third insulating layer PAS3 may be disposed on the third connection electrode CNE3 and the second insulating layer PAS2. The third insulating layer PAS3 may be disposed (e.g., entirely disposed) on the second insulating layer PAS2 and cover the third connection electrode CNE3. The first connection electrode CNE1 and the second connection electrode CNE2 may be disposed on the third insulating layer PAS3. The third insulating layer PAS3 may be disposed (e.g., entirely disposed) on the via layer VIA except for the area in which the first connection electrode CNE1 and the second connection electrode CNE2 are disposed. For example, the third insulating layer PAS3 may be disposed on the bank pattern BP, the bank BNL, the first insulating layer PAS1, and the second insulating layer PAS2. The third insulating layer PAS3 may mutually and electrically insulate the first connection electrode CNE1 and the second connection electrode CNE2 from the third connection electrode CNE3. Thus, the first connection electrode CNE1 and the second connection electrode CNE2 may not be directly in contact with the third connection electrode CNE3.

In some embodiments, the third insulating layer PAS3 may be omitted from the display device 10. Therefore, the connection electrodes CNE may be disposed (e.g., directly disposed) on the second insulating layer PAS2 and disposed in substantially a same layer.

Although not shown, another insulating layer may be further disposed on the third insulating layer PAS3 and the connection electrodes CNE. The insulating layer may protect members disposed on the substrate SUB against an external environment. The first insulating layer PAS1, the second insulating layer PAS2, and the third insulating layer PAS3 may include an inorganic insulating material or an organic insulating material, but the disclosure is not limited thereto.

As described above, the conductive patterns (or lines) formed in each of the subpixels SPXn may be different from each other. When different types of conductive patterns are disposed for each of the subpixels SPXn, a step difference due to the conductive patterns may be differently formed. For example, in some areas, two conductive patterns may be stacked and overlap each other in a thickness direction, and in other areas, three conductive patterns may be stacked and overlap one another in the thickness direction. Therefore, an insulating layer (e.g., a second insulating layer PAS2) formed on the conductive patterns may be formed differently from a critical dimension (CD) set by a step difference at the lower portion. The second insulating layer PAS2 may expose both ends of the light emitting elements ED in an area (hereinafter, referred to as an 'alignment area') in which the light emitting elements ED are aligned. Thus, the connection electrodes CNE may be in contact with the light emitting elements ED. However, when the critical dimension of the second insulating layer PAS2 is distorted, a contact defect between the light emitting element ED and the connection electrodes CNE may occur.

The display device 10 according to an embodiment of the disclosure may similarly form step differences of lower conductive patterns corresponding to the alignment area in which light emitting elements ED are disposed in each subpixel SPXn.

Figure 10:
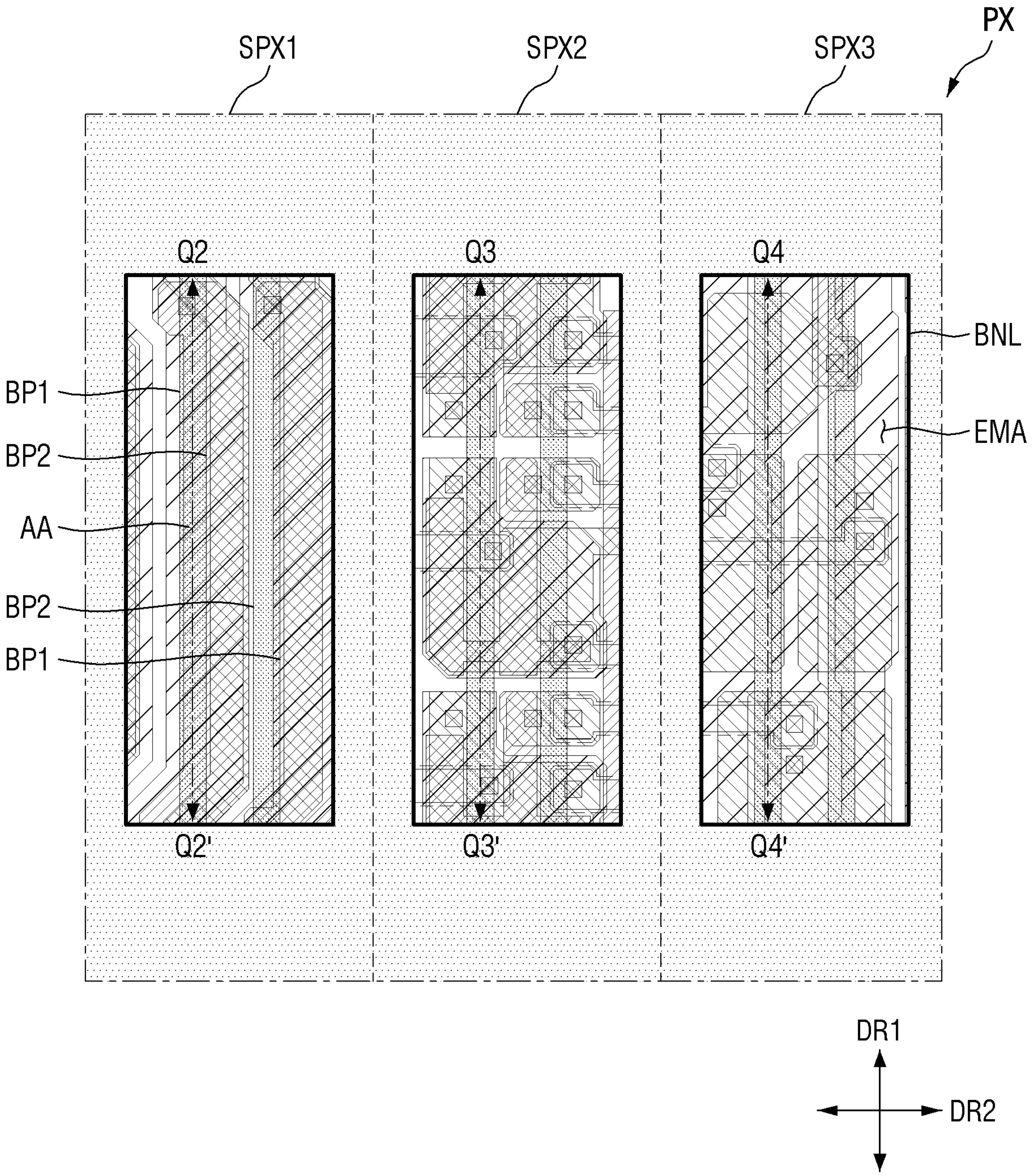
FIG. 10 is a schematic layout view illustrating lines and a bank, which are disposed in a pixel of a display device according to an embodiment.
Figure 11:
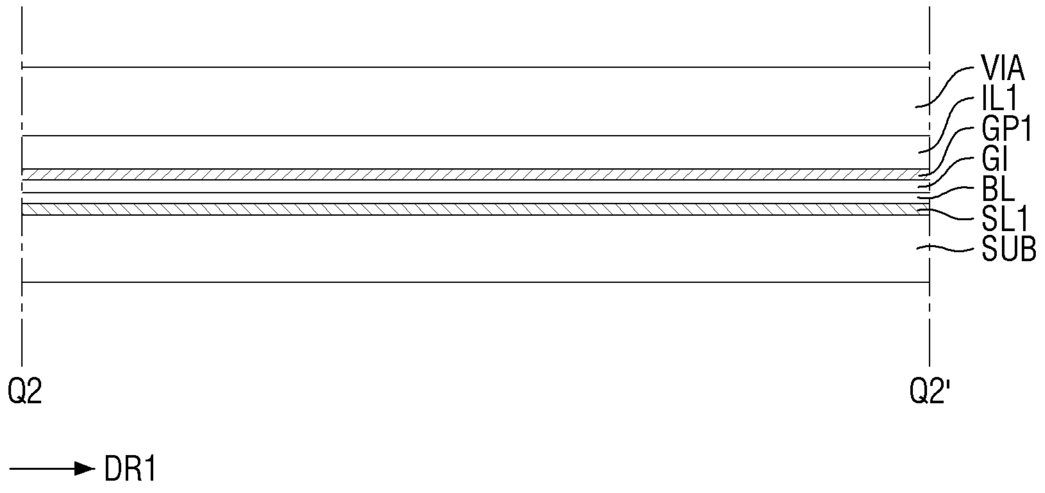
FIG. 11 is a schematic cross-sectional view taken along lines Q2-Q2' of FIG.
Figure 12:
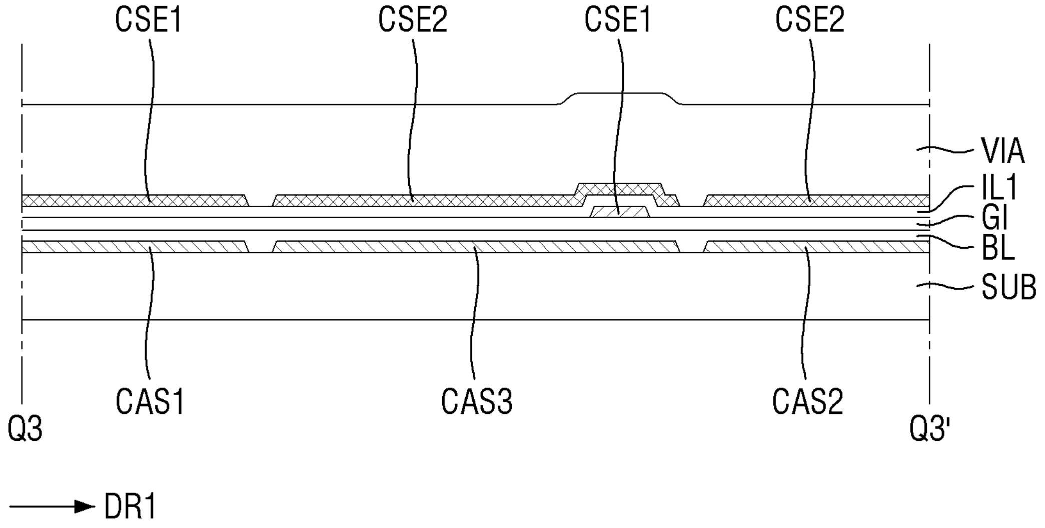
FIG. 12 is a schematic cross-sectional view taken along lines Q3-Q3' of FIG. 10.
Figure 13:
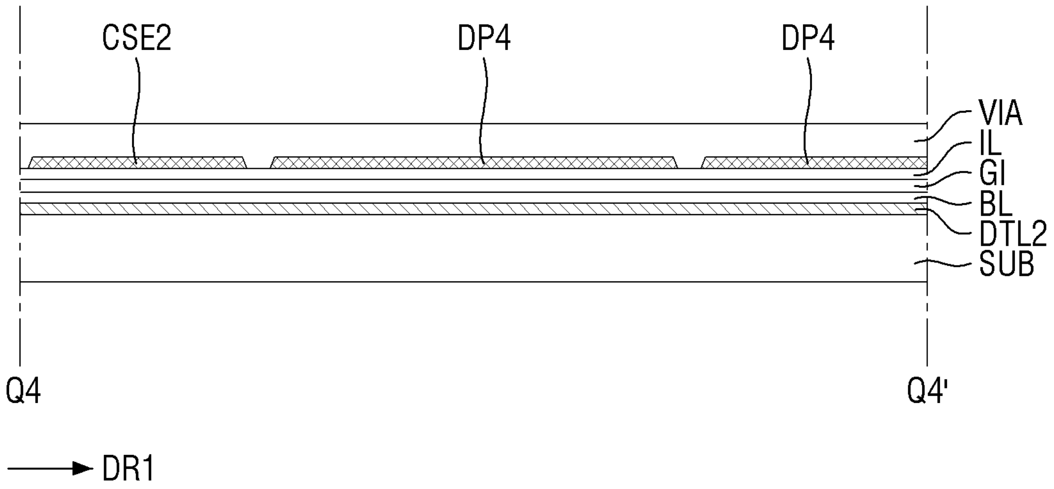
FIG. 13 is a schematic cross-sectional view taken along lines Q4-Q4' of FIG. 10.

FIG. 10 is a schematic layout view illustrating lines and a bank, which are disposed in a pixel of a display device according to an embodiment. FIG. 11 is a schematic cross-sectional view taken along lines Q2-Q2' of FIG. 10. FIG. 12 is a schematic cross-sectional view taken along lines Q3-Q3' of FIG. 10. FIG. 13 is a schematic cross-sectional view taken along lines Q4-Q4' of FIG. 10.

FIG. 10 further illustrates bank patterns and a bank in addition to FIG. 4. FIG. 11 illustrates conductive layers disposed below the alignment area in which the light emitting elements ED of the first subpixel SPX1 are disposed. FIG. 12 illustrates conductive layers disposed below the alignment area in which the light emitting elements ED of the second subpixel SPX2 are disposed. FIG. 13 illustrates conductive layers disposed below the alignment area in which the light emitting elements ED of the third subpixel SPX3 are disposed. In FIGS. 11 to 13, semiconductor layers, which have an insignificant step difference due to a very small thickness, may be omitted.

Referring to FIG. 10, in each subpixel SPXn, the light emission area EMA and the sub-area (not shown) may be partitioned (e.g., defined or surrounded) by the bank BNL. Alignment areas AA, in which light emitting elements are aligned between the bank patterns BP1 and BP2, may be disposed in the light emission area EMA of each subpixel SPXn. For example, two alignment areas AA extended in the first direction DR1 and spaced apart from each other in the second direction DR2 may be disposed between the first bank pattern BP1 and the second bank pattern BP2 in each subpixel SPXn. The alignment area AA may be defined as an area disposed between the bank patterns BP1 and BP2 in the light emission area EMA. For example, the alignment area AA may be an area surrounded by the bank BNL, the first bank pattern BP1, and the second bank pattern BP2.

According to an embodiment, the conductive layers below the via layer VIA disposed in the alignment area AA may be disposed to satisfy a step difference matching rate represented by Equation 1 below.

$$\frac{\mathrm{Max}(a, b, c, d) \times f(x)}{(a \times A) + (b \times B) + (c \times C) + (d \times D)} \geq 80\% \qquad \text{[Equation 1]}$$

In Equation 1, "a" is a length of the area, in which three conductive layers overlap one another in the alignment area AA, in the first direction DR1, and "A" is a width of the area, in which three conductive layers overlap one another in the alignment area AA, in the second direction DR2. "b" is a length of the area, in which two conductive layers overlap each other in the alignment area AA, in the first direction DR2, and "B" is a width of the area, in which two conductive layers overlap each other in the alignment area AA, in the second direction DR2. "c" is a length of the area, in which a conductive layer is disposed in the alignment area AA, in the first direction DR2, and "C" is a width of the area, in which a conductive layer is disposed in the alignment area AA, in the second direction DR2. "d" is a length of the area, in which no conductive layer is disposed in the alignment area AA, in the first direction DR1, and "D" is a width of the area, in which no conductive layer is disposed in the alignment area AA, in the second direction DR2. Max(a, b, c, d) is any one of the largest values among a, b, c and d, and f(x) is a width of any one, which has the largest values among a, b, c and d, in the second direction DR2. For example, when "a" has the largest value among a, b, c and d, f(x) is "A".

In Equation 1, any one of a, b, c, and d, which occupies the largest planar area within the alignment area AA, may be disposed to be about 80% or more, and a step difference (or height or thickness difference) due to the conductive layers in the alignment area AA may be minimized. For example, the area, in which three conductive layers overlap one another in a plan view, may be disposed to occupy about 80% or more in the alignment areas AA of each subpixel SPXn. In another embodiment, the area, in which two conductive layers overlap each other in a plan view, may be disposed to occupy about 80% or more in the alignment areas AA of each subpixel SPXn, but the disclosure is not limited thereto.

In an embodiment illustrated in FIG. 10, the area, in which two conductive layers overlap each other in a plan view, may occupy about 80% or more in the alignment area AA of each subpixel SPXn.

Referring to FIG. 11 in conjunction with FIG. 10, a cross-sectional structure of the alignment area AA disposed on the left side in the light emission area EMA of the first subpixel SPX1 is shown. The first conductive layer may be disposed on the substrate SUB. The first conductive layer may include a first scan line SL1 extended in the first direction DR1. The first scan line SL1 may overlap the alignment area AA in a plan view, and for example, the first scan line SL1 may overlap the entire alignment area AA in a plan view.

The buffer layer BL may be disposed on the first scan line SL1, and the first gate insulating layer GI may be disposed on the buffer layer BL. The second conductive layer may be disposed on the first gate insulating layer GI. The second conductive layer may include a first gate pattern GP1 extended in the first direction DR1. The first gate pattern GP1 may overlap the alignment area AA in a plan view, and for example, the first gate pattern GP1 may overlap the entire alignment area AA in a plan view. The first gate pattern GP1 may overlap the first scan line SL1 in a plan view.

The first interlayer insulating layer IL1 may be disposed on the first gate pattern GP1, and the via layer VIA may be disposed on the first interlayer insulating layer ILI. In the alignment areas AA of the first subpixel SPX1, the third conductive layer may not be disposed between the first interlayer insulating layer IL1 and the via layer VIA.

In the alignment area AA disposed on the right side of the alignment area AA of the first subpixel SPX1, the second scan line SL2 that is the first conductive layer, and the second gate pattern GP2 that is the second conductive layer may be disposed to overlap each other in a plan view.

In an embodiment, the area in which the first conductive layer and the second conductive layer overlap each other in the thickness direction may be about 80% or more in the alignment areas AA of the first subpixel SPX1. In an embodiment as illustrated in FIG. 11, the first scan line SL1 that is the first conductive layer may overlap the first gate pattern GP1 that is the second conductive layer, may overlap each other in a plan view, and the overlapping area may be about 80% or more in the alignment area AA extended in the first direction DR1. Since the first scan line SL1 and the first gate pattern GP1 overlap each other in the entire alignment area AA in a plan view, the via layer VIA formed on the upper portion may be formed to be flat. Therefore, as shown in FIG. 9, since the second insulating layer PAS2 exposing both ends of the light emitting element ED on the flat via layer VIA may be formed without distortion of a critical dimension, a contact defect between the light emitting element ED and the connection electrodes CNE may be avoided (or prevented).

Referring to FIG. 12 in conjunction with FIG. 10, a cross-sectional structure of an alignment area AA disposed on a left side in the light emission area EMA of the second subpixel SPX2 is shown. The first conductive layer may be disposed on the substrate SUB. The first conductive layer may include a first lower metal layer CAS1, a second lower metal layer CAS2, and a third lower metal layer CAS3, which are disposed to be spaced apart from one another in the first direction DR1. The first lower metal layer CAS1 may be disposed above the alignment area AA. The second lower metal layer CAS2 may be disposed below the alignment area AA. The third lower metal layer CAS3 may be disposed between the first lower metal layer CAS1 and the second lower metal layer CAS2.

The buffer layer BL may be disposed on the first to third lower metal layers CAS1, CAS2, and CAS3. The first gate insulating layer GI may be disposed on the buffer layer BL. The second conductive layer may be disposed on the first gate insulating layer GI. The second conductive layer may include a first capacitance electrode CSE1. The first capacitance electrode CSE1 may be disposed on the third lower metal layer CAS3 and partially overlap the third lower metal layer CAS3 in a plan view. As shown in FIG. 10, in the second subpixel SPX2, the first capacitance electrode CSE1 may overlap the first lower metal layer CAS1 in a plan view, and the first capacitance electrode CSE1 may overlap the second lower metal layer CAS2 in a plan view. In the embodiment, the first capacitance electrode CSE1 may overlap the first lower metal layer CAS1 in a plan view, and may not overlap the alignment area AA in a plan view. The first capacitance electrode CSE1 may overlap the second lower metal layer CAS2 in a plan view, and may be disposed so as not to overlap the alignment area AA in a plan view. Therefore, in the arrangement area AA disposed on the left side in the second subpixel SPX2, a portion of the first capacitance electrode CSE1 may overlap the third lower metal layer CAS3 in a plan view, and the arrangement of the second conductive layer in the alignment area AA may be minimized.

The first interlayer insulating layer IL1 may be disposed on the first capacitance electrode CSE1, and the third conductive layer may be disposed on the first interlayer insulating layer ILL The second capacitance electrodes CSE2 spaced apart from each other in the first direction DR1 may be disposed on the third conductive layer. The second capacitance electrodes CSE2 may overlap the first to third lower metal layers CAS1, CAS2, and CAS3, respectively, in the thickness direction. For example, the second capacitance electrode CSE2 disposed above the alignment area AA may overlap the first lower metal layer CAS1 in a plan view. The second capacitance electrode CSE2 disposed below the alignment area AA may overlap the second lower metal layer CAS2 in a plan view. The second capacitance electrode CSE2 disposed at the center of the alignment area AA may overlap the third lower metal layer CAS3 in a plan view. The second capacitance electrode CSE2 disposed at the center of the alignment area AA may overlap the first capacitance electrode CSE2 and the third lower metal layer CAS3 in a plan view.

The via layer VIA may be disposed on the second capacitance electrode CSE2. In the alignment area AA disposed on the right side of the alignment area AA of the first subpixel SPX1, the first to third lower metal layers CAS1, CAS2, and CAS3, which are the first conductive layers, and the second capacitance electrodes CSE2, which are the third conductive layer, may be disposed to overlap each other in a plan view.

In an embodiment, the area, in which the first conductive layer and the third conductive layer overlap each other in the thickness direction, may be about 80% or more in the alignment areas AA of the second subpixel SPX2. In an embodiment as shown in FIG. 12, the first to third lower metal layers CAS1, CAS2, and CAS3 that are the first conductive layers may overlap the second capacitance electrodes CSE2 that are the third conductive layers in a plan view, and the overlapping area may be about 80% or more in the alignment area AA extended in the first direction DR1. The first to third lower metal layers CAS1, CAS2, and CAS3 and the second capacitance electrodes CSE2 may overlap each other in a plan view at least 80% or more in the alignment area AA, and the via layer VIA formed on the upper portion may be generally flat.

Referring to FIG. 13 in conjunction with FIG. 10, the first conductive layer may be disposed on the substrate SUB in a cross-sectional structure of the alignment area AA disposed on the left side of the light emission area EMA of the third subpixel SPX3. The first conductive layer may include a second data line DTL2 extended in the first direction DR1. The second data line DTL2 may overlap the alignment area AA in a plan view, and for example, the second data line DTL2 may overlap the entire alignment area AA in a plan view.

The buffer layer BL may be disposed on the second data line DTL2. The first gate insulating layer GI may be disposed on the buffer layer BL. The first interlayer insulating layer IL1 may be disposed on the first gate insulating layer GI. The second conductive layer may not be disposed between the first gate insulating layer GI and the first interlayer insulating layer ILI.

The third conductive layer may be disposed on the first interlayer insulating layer ILL The third conductive layer may include a second capacitance electrode CSE2 and fourth conductive patterns DP4, which are spaced apart from each other in the first direction DR1. The second capacitance electrode CSE2 may overlap the third lower metal layer CAS3 of the second subpixel SPX2 in a plan view, and may be extended to the third subpixel SPX3. The second capacitance electrode CSE2 may be disposed at an upper side in the alignment area AA. The fourth conductive pattern DP4 may be disposed below the second capacitance electrode CSE2 may be a pattern connected to the first data line DTL1. The fourth conductive pattern DP4 disposed at a lower side in the alignment area AA may be a pattern electrically connected to the second data line DTL2. For example, the fourth conductive pattern DP4 may be electrically connected to the second data line DTL2. The second capacitance electrode CSE2 and the fourth conductive patterns DP4 may overlap the second data line DTL2 therebelow in a plan view.

The via layer VIA may be disposed on the second capacitance electrode CSE2 and the fourth conductive patterns DP4. The third data line DTL3 that is included in the first conductive layer, the second capacitance electrode CSE2 that is included in the third conductive layer, and the fourth conductive patterns DP4 that is included in the third conductive layer may overlap each other even in an alignment area AA disposed on the right side of the third subpixel SPX3.

In an embodiment, the area in which the first conductive layer and the third conductive layer overlap each other in the thickness direction may be about 80% or more in the alignment areas AA of the third subpixel SPX3. In an embodiment as shown in FIG. 13, the area, in which the second data line DTL2 that is the first conductive layer overlaps the second capacitance electrode CSE2 and the fourth conductive pattern DP4 in a plan view, may be about 80% or more in the alignment area AA extended in the first direction DR1. The second capacitance electrode CSE2 and the fourth conductive pattern DP4 may be included in the third conductive layer. The second data line DTL2 may overlap the second capacitance electrodes CSE2 and the fourth conductive patterns DP4 at about 80% or more in the alignment area AA in a plan view. Thus, the via layer VIA formed on the upper portion may be generally flat. Therefore, as shown in FIG. 9, since the second insulating layer PAS2 exposing both ends of the light emitting element ED on the flat via layer VIA may be formed without distortion of a critical dimension, a contact defect between the light emitting element ED and the connection electrodes CNE may be avoided (or prevented).

Figure 14:
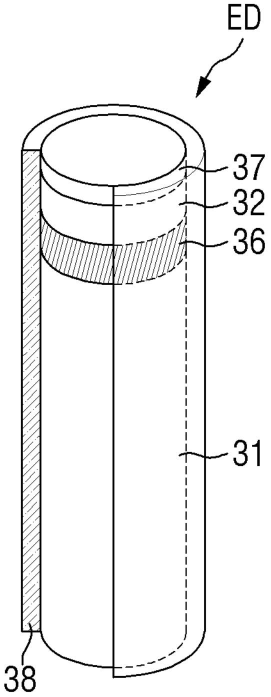
FIG. 14 is a schematic view illustrating a light emitting element according to an embodiment.

FIG. 14 is a schematic view illustrating a light emitting element according to an embodiment.

Referring to FIG. 14, the light emitting element ED may be a light emitting diode. For example, the light emitting element ED may be an inorganic light emitting diode made of an inorganic material with a size of a nano-meter to a micro-meter. The light emitting element ED may be aligned between two electrodes facing each other and having polarities in accordance with an electric field formed in a direction (e.g., a specific or selectable direction) between the two electrodes.

The light emitting element ED according to an embodiment may have a shape extending in a direction. The light emitting element ED may have a shape such as a cylinder, a rod, a wire, a tube, or the like. However, the disclosure is not limited thereto. The light emitting element ED may have a polygonal pillar shape such as a cube, a cuboid and a hexagonal pillar. In other embodiments, the light emitting element ED may have various shapes such as a shape extending in a direction and having an outer surface that is partially inclined.

The light emitting element ED may include a semiconductor layer doped with any conductivity type (e.g., p-type or n-type) dopants. The semiconductor layer may emit light of a wavelength band (e.g., a specific or selectable wavelength band) as an electrical signal applied from an external power source is transferred thereto. The light emitting element ED may include a first semiconductor layer 31, a second semiconductor layer 32, a light emitting layer 36, an electrode layer 37, and an insulating layer 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y \le 1$, $0 \le x+y \le 1$). For example, the first semiconductor layer 31 may include at least one of AlGaInN, GaN, AlGaN, InGaN, AlN, and InN, which are doped with n-type dopants. The n-type dopants doped in the first semiconductor layer 31 may include at least one of Si, Ge, Sn, and Se. However, the disclosure is not limited thereto.

The second semiconductor layer 32 may be disposed on the first semiconductor layer 31, and the light emitting layer 36 may be disposed between the first semiconductor layer 31 and the second semiconductor layer 32. The second semiconductor layer 32 may be a p-type semiconductor, and may include a semiconductor material having a chemical formula of $Al_xGa_yIn_{1-x-y}N$ ($0 \le x \le 1$, $0 \le y \le 1$, $0 \le x+y<1$). For example, the second semiconductor layer 32 may include at least one of AlGaInN, GaN, AlGaN, InGaN, A1N, and InN, which are doped with p-type dopants. The p-type dopants doped in the second semiconductor layer 32 may include at least one of Mg, Zn, Ca, and Ba. However, the disclosure is not limited thereto.

The first semiconductor layer 31 and the second semiconductor layer 32 may be formed of a single layer, but the disclosure is not limited thereto. The first semiconductor layer 31 and the second semiconductor layer 32 may further include a larger number of layers, such as a clad layer or a tensile strain barrier reducing (TSBR) layer, depending on the material of the light emitting layer 36. For example, the light emitting element ED may further include another semiconductor layer disposed between the first semiconductor layer 31 and the light emitting layer 36, or between the second semiconductor layer 32 and the light emitting layer 36. The semiconductor layer disposed between the first semiconductor layer 31 and the light emitting layer 36 may include at least one of AlGaInN, GaN, AlGaN, InGaN, AlN, InN, and SLs, which are doped with n-type dopants. The semiconductor layer disposed between the second semiconductor layer 32 and the light emitting layer 36 may include at least one of AlGaInN, GaN, AlGaN, InGaN, AlN, and InN, which are doped with p-type dopants.

The light emitting layer 36 may be disposed between the first semiconductor layer 31 and the second semiconductor layer 32. The light emitting layer 36 may include a material of a single or multiple quantum well structure. When the light emitting layer 36 includes a material of a multiple quantum well structure, quantum layers and well layers may be alternately stacked one another in the light emitting layer 36. Electron-hole pairs may be combined in accordance with electrical signals applied through the first semiconductor layer 31 and the second semiconductor layer 32, and the light emitting layer 36 may emit light. The light emitting layer 36 may include at least one material of AlGaN, AlGaInN, and InGaN. For example, in case that the light emitting layer 36 has a stacked structure of quantum layers and well layers, which are alternately stacked one another in a multiple quantum well structure, the quantum layer of the light emitting layer 36 may include a material such as AlGaN or AlGaInN, and the well layer of the light emitting layer 36 may include a material such as GaN or AlInN.

The light emitting layer 36 may have a structure in which a semiconductor material having a large band gap energy and semiconductor materials having a small band gap energy are alternately stacked each other. The light emitting layer 36 may include group-III or group-V semiconductor materials depending on a wavelength band of light that is emitted. The light emitting layer 36 may not be limited to the above-described light of the blue wavelength band, but is not limited thereto and may emit light of a red or green wavelength band.

The electrode layer 37 may be an ohmic connection electrode, but the disclosure is not limited thereto. The electrode layer 37 may be a Schottky connection electrode. The light emitting element ED may include at least one electrode layer 37. Although the light emitting element ED may include one or more electrode layers 37, the disclosure is not limited thereto. The electrode layer 37 may be omitted.

The electrode layer 370 may reduce resistance between the light emitting element ED and an electrode (or a connection electrode) when the light emitting element ED is electrically connected with the electrode (or the connection electrode) in the display device 10. The electrode layer 37 may include a metal having conductivity. For example, the electrode layer 37 may include at least one of Al, Ti, In, Au, Ag, ITO, IZO, and ITZO.

The insulating layer 38 may be disposed to surround outer surfaces of the above-described semiconductor layers and the electrode layer 37. For example, the insulating layer 38 may be disposed to surround at least an outer surface of the light emitting layer 36, and may be formed to expose ends (e.g., both ends) of the light emitting element ED in a longitudinal direction. Also, the insulating layer 38 may be formed with a rounded upper surface on a section in an area adjacent to at least one end of the light emitting element ED.

The insulating layer 38 may include materials having insulation property. For example, the insulating layer 38 may include at least one of silicon oxide (SiOx), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), and titanium oxide ($TiO_x$). The insulating layer 38 is illustrated as being formed of a single layer, but the disclosure is not limited thereto. In some embodiments, the insulating layer 38 may be formed in a multi-layered structure in which layers are stacked one another.

The insulating layer 38 may protect the semiconductor layers and the electrode layer of the light emitting element ED. The insulating layer 38 may prevent an electrical short that may occur in the light emitting layer 36 when the light emitting element ED is in contact with (e.g., directly in contact with) the electrode to which the electrical signal is transferred. Also, the insulating layer 38 may prevent light emitting efficiency of the light emitting element ED from being deteriorated.

The outer surface of the insulating layer 38 may be surface-treated. The light emitting elements ED may be dispersed in an ink (e.g., a predetermined or selectable ink) and sprayed onto the electrode, and the light emitting elements ED may be aligned between the two electrodes. The surface of the insulating layer 38 may be hydrophobic-treated or hydrophilic-treated. Thus, the light emitting element ED may be maintained to be dispersed in the ink without being condensed with another light emitting element ED adjacent thereto.

Hereinafter, description of a display device 10 according to another embodiment is provided with reference to other drawings.

Figure 15:
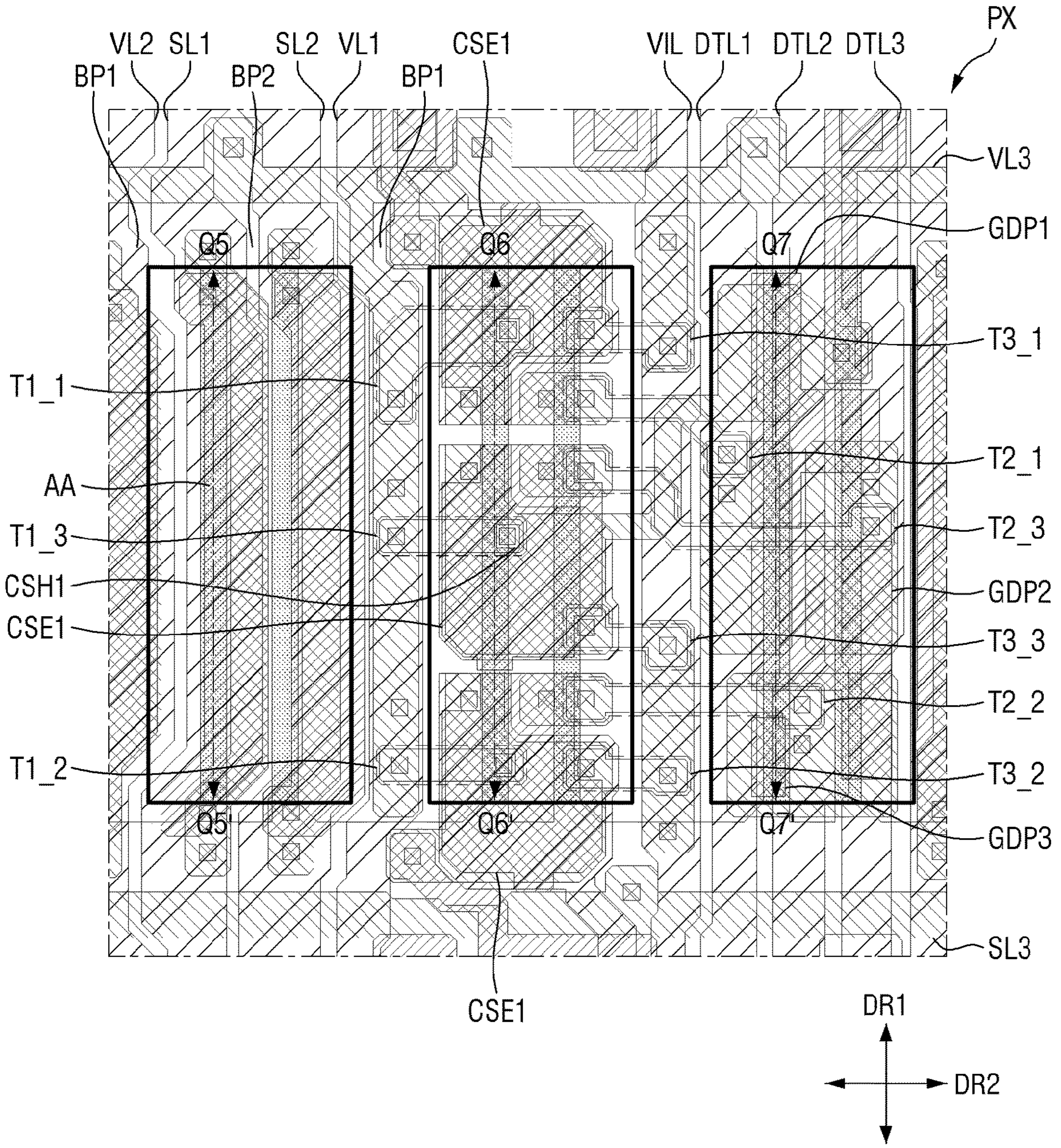
FIG. 15 is a schematic layout view illustrating lines and a bank, which are disposed in a pixel of a display device according to another embodiment.
Figure 16:
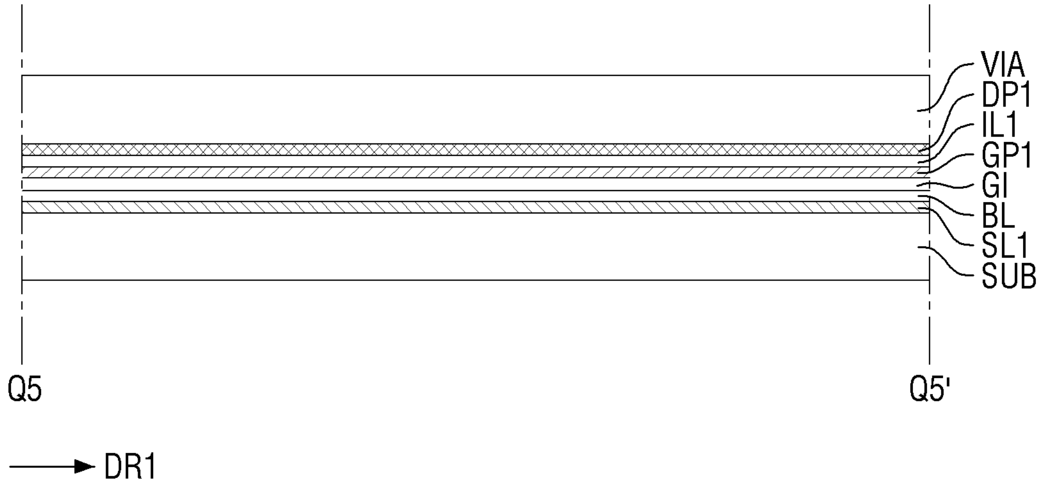
FIG. 16 is a schematic cross-sectional view taken along lines Q5-Q5' of FIG. 15.
Figure 17:
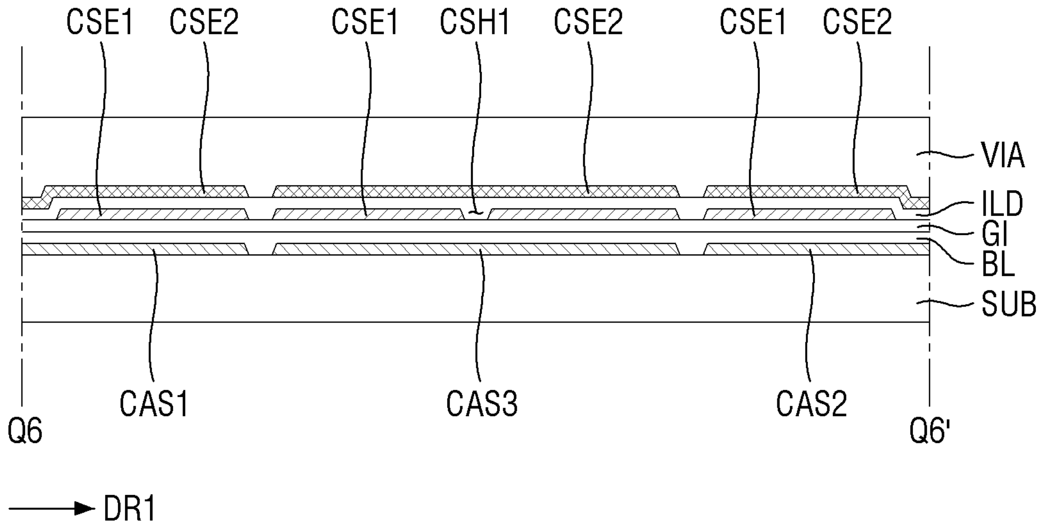
FIG. 17 is a schematic cross-sectional view taken along lines Q6-Q6' of FIG. 15.
Figure 18:
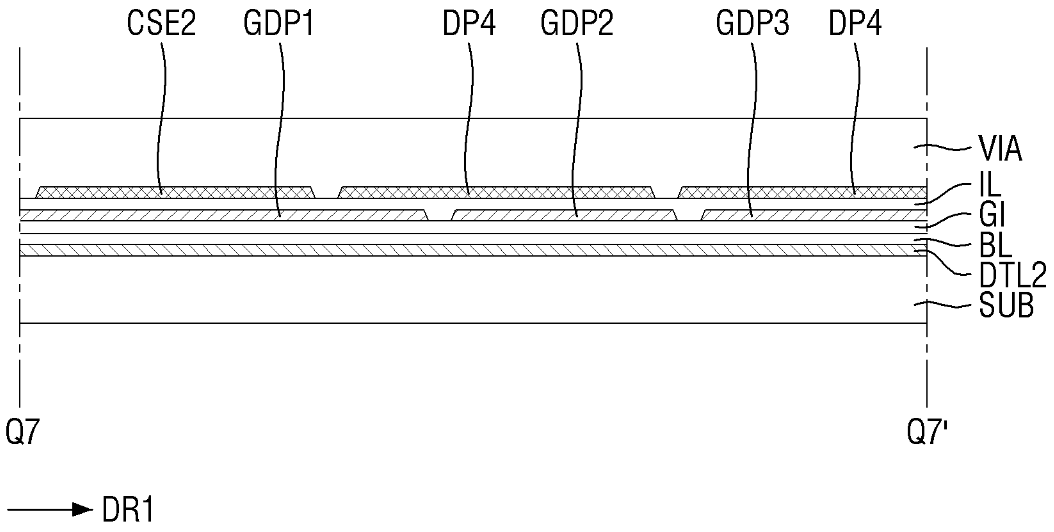
FIG. 18 is a schematic cross-sectional view taken along lines Q7-Q7' of FIG. 15.

FIG. 15 is a schematic layout view illustrating lines and a bank, which are disposed in a pixel of a display device according to another embodiment. FIG. 16 is a schematic cross-sectional view taken along lines Q5-Q5' of FIG. 15. FIG. 17 is a schematic cross-sectional view taken along lines Q6-Q6' of FIG. 15. FIG. 18 is a schematic cross-sectional view taken along lines Q7-Q7' of FIG. 15.

FIG. 15 is a layout view illustrating lines of a first conductive layer, lines of a second conductive layer, lines of a third conductive layer, which are disposed in a pixel PX of the display device 10, an active layers ACT of a semiconductor layer, bank patterns, and a bank. FIG. 16 illustrates conductive layers disposed below an alignment area in which light emitting elements ED of a first subpixel SPX1 are disposed. FIG. 17 illustrates conductive layers disposed below an alignment area in which light emitting elements ED of a second subpixel SPX2 are disposed. FIG. 18 illustrates conductive layers disposed below an alignment area in which light emitting elements ED of a third subpixel SPX3 are disposed. In FIGS. 16 to 18, semiconductor layers, which have an insignificant step difference due to a very small thickness, are omitted.

The embodiment of FIGS. 15 to 18 is different from the embodiment of FIGS. 10 to 13 at least in that the area in which three conductive layers overlap one another in a plan view occupies about 80% or more in an alignment area AA of each subpixel SPXn. Hereinafter, detailed description of the same constituent elements is omitted, and the following description is provided based on a difference from the embodiment of FIGS. 10 to 13.

Referring to FIG. 16 in conjunction with FIG. 15, a cross-sectional structure of the alignment area AA disposed on the left side in the light emission area EMA of the first subpixel SPX1 is shown. A first conductive layer may be disposed on a substrate SUB. The first conductive layer may include a first scan line SL1 extended in a first direction DR1. The first scan line SL1 may overlap the alignment area AA in a plan view, and for example, the first scan line SL1 may overlap the entire alignment area AA in a plan view.

A buffer layer BL may be disposed on the first scan line SL1, and a first gate insulating layer GI may be disposed on the buffer layer BL. A second conductive layer may be disposed on the first gate insulating layer GI. The second conductive layer may include a first gate pattern GP1 extended in the first direction DR1. The first gate pattern GP1 may overlap the alignment area AA in a plan view, and for example, the first gate pattern GP1 may overlap the entire alignment area AA in a plan view. The first gate pattern GP1 may overlap the first scan line SL1 in a plan view.

A first interlayer insulating layer IL1 may be disposed on the first gate pattern GP1, and a third conductive layer may be disposed on the first interlayer insulating layer A first conductive pattern DP1 may overlap the alignment area AA in a plan view, and for example, the first conductive pattern DP1 may overlap the entire alignment area AA in a plan view. The first conductive pattern DP1 may overlap the first scan line SL1 and the first gate pattern GP1 in a plan view.

A via layer VIA may be disposed on the first conductive pattern DP1. In the alignment area AA (e.g., a part of the alignment area AA) of the first subpixel SPX1, the first scan line SL1 that is the first conductive layer, the first gate pattern GP1 that is the second conductive layer, and the first conductive pattern DP1 that is the third conductive layer may overlap one another in a plan view. In an alignment area AA disposed on the a right side of the first subpixel SPX1 among the alignment areas AA of the first subpixel SPX1, the second scan line SL2 that is the first conductive layer, the second gate pattern that is the second conductive layer, and the second gate pattern GP2 that is third conductive layer may overlap one another in a plan view.

In an embodiment, the area in which the first conductive layer, the second conductive layer, and the third conductive layer overlap one another in a thickness direction may be about 80% or more in the alignment areas AA of the first subpixel SPX1. In an embodiment as illustrated in FIG. 16, the area, in which the second scan line SL1 that is the first conductive layer, the first gate pattern GP1 that is the second conductive layer, and the first conductive pattern DP1 that is the third conductive layer overlap one another in a plan view, may be about 80% or more in the alignment area AA extended in the first direction DR1. The first scan line SL1, the first gate pattern GP1, and the first conductive pattern DP1 may overlap one another in the entire alignment area AA in a plan view, and the via layer VIA formed on the upper portion may be flat. Therefore, as shown in FIG. 9, since the second insulating layer PAS2 exposing both ends of the light emitting element ED on the flat via layer VIA may be formed without distortion of a critical dimension, a contact defect between the light emitting element ED and the connection electrodes CNE may be avoided (or prevented).

Referring to FIG. 17 in conjunction with FIG. 15, a cross-sectional structure of an alignment area AA disposed on a left side in the light emission area EMA of the second subpixel SPX2 is shown. The first conductive layer may be disposed on the substrate SUB. The first conductive layer may include a first lower metal layer CAS1, a second lower metal layer CAS2, and a third lower metal layer CAS3, which are disposed to be spaced apart from one another in the first direction DR1. The first lower metal layer CAS1 may be disposed above the alignment area AA. The second lower metal layer CAS2 may be disposed below the alignment area AA. The third lower metal layer CAS3 may be disposed between the first lower metal layer CAS1 and the second lower metal layer CAS2.

The buffer layer BL may be disposed on the first to third lower metal layers CAS1, CAS2, and CAS3. The first gate insulating layer GI may be disposed on the buffer layer BL. The second conductive layer may be disposed on the first gate insulating layer GI. The second conductive layer may include first capacitance electrodes CSE1. The first capacitance electrodes CSE1 may be disposed on the first to third lower metal layers CAS1, CAS2, and CAS3 and partially overlap the first to third lower metal layers CAS1, CAS2, and CAS3 in a plan view. As shown in FIG. 15, in the second subpixel SPX2, the first capacitance electrode CSE1 may overlap the first lower metal layer CAS1 in a plan view, and the first capacitance electrode CSE1 may overlap the second lower metal layer CAS2. Also, the first capacitance electrode CSE1 may overlap the third lower metal layer CAS3 in a plan view. In the embodiment, the first capacitance electrode CSE1 overlapping the first lower metal layer CAS1 in a plan view, the first capacitance electrode CSE1 overlapping the second lower metal layer CAS2 in a plan view, and the first capacitance electrode CSE1 overlapping the third lower metal layer CAS3 in a plan view may overlap the alignment area AA in a plan view. In an embodiment, the first capacitance electrode CSE1 overlapping the third lower metal layer CAS3 in a plan view may include an electrode hole CSH1 and increase the area overlapping the alignment area AA in a plan view. Therefore, in the arrangement area AA disposed in the second subpixel SPX2, the first capacitance electrode CSE1 may overlap the first to third lower metal layers CAS1, CAS2, and CAS3 in a plan view. Thus, the arrangement of the third conductive layer in the alignment area AA may be maximized.

The first interlayer insulating layer IL1 may be disposed on the first capacitance electrodes CSE1. The third conductive layer may be disposed on the first interlayer insulating layer IL 1. The second capacitance electrodes CSE2 may be spaced apart from each other in the first direction DR1 and disposed on the third conductive layer. The second capacitance electrodes CSE2 may overlap the first to third lower metal layers CAS1, CAS2, and CAS3 and the first capacitance electrodes CSE1, respectively, in the thickness direction. For example, the second capacitance electrode CSE2 may be disposed above the alignment area AA and overlap the first lower metal layer CAS1 and the first capacitance electrode CSE1 in a plan view. The second capacitance electrode CSE2 may be disposed below the alignment area AA and overlap the second lower metal layer CAS2 and the first capacitance electrode CSE1 in a plan view. The second capacitance electrode CSE2 may be disposed at the center of the alignment area AA and overlap the third lower metal layer CAS3 and the first capacitance electrode CSE1 in a plan view. The second capacitance electrode CSE2 may be disposed at the center of the alignment area AA and overlap the electrode hole CSH1 of the first capacitance electrode CSE2 and the third lower metal layer CAS3 in a plan view.

The via layer VIA may be disposed on the second capacitance electrodes CSE2. In an alignment area AA disposed on the right side of the first subpixel SPX1 among the alignment areas AA of the first subpixel SPX1, the first to third lower metal layers CAS1, CAS2, and CAS3 that are the first conductive layers, the first capacitance electrodes CSE1 that are the second conductive layers, and the second capacitance electrodes CSE2 that are the third conductive layer may be disposed to overlap one another in a plan view.

In an embodiment, the area, in which the first conductive layer, the second conductive layer, and the third conductive layer overlap one another in the thickness direction, may be about 80% or more in the alignment areas AA of the second subpixel SPX2. In an embodiment as shown in FIG. 17, the area, in which the first to third lower metal layers CAS1, CAS2, and CAS3 that are the first conductive layers, the first capacitance electrode CSE1 that is the second conductive layer, and the second capacitance electrodes CSE2 that are the third conductive layers overlap one another in a plan view, may be about 80% or more in the alignment area AA extended in the first direction DR1. The first to third lower metal layers CAS1, CAS2, and CAS3, the first capacitance electrode CSE1, and the second capacitance electrodes CSE2 may overlap one another in a plan view at about 80% or more in the alignment area AA. Thus, the via layer VIA formed on the upper portion may be generally flat.

Referring to FIG. 18 in conjunction with FIG. 15, the first conductive layer may be disposed on the substrate SUB in a cross-sectional structure of the alignment area AA disposed on the left side of the light emission area EMA of the third subpixel SPX3. The first conductive layer may include a second data line DTL2 extended in the first direction DR1. The second data line DTL2 may overlap the alignment area AA in a plan view, and for example, the second data line DTL2 may overlap the entire alignment area AA in a plan view.

The buffer layer BL may be disposed on the second data line DTL2. The first gate insulating layer GI may be disposed on the buffer layer BL. The second conductive layer may be disposed on the first gate insulating layer GI. The second conductive layer may include a first dummy pattern GDP1, a second dummy pattern GDP2, and a third dummy pattern GDP3, which are spaced apart from one another in the first direction DR1. The first dummy pattern GDP1 may be disposed above the third subpixel SPX3, and may overlap two alignment areas AA and the second data line DTL2 in a plan view. The second dummy pattern GDP2 may be disposed below the first dummy pattern GDP1, and may overlap two alignment areas AA and the second data line DTL2 in a plan view. The third dummy pattern GDP3 may be disposed below the third subpixel SPX3, and may overlap the left alignment area AA and the second data line DTL2 in a plan view. The first dummy pattern GDP1, the second dummy pattern GDP2, and the third dummy pattern GDP3 may be floating patterns, and may not be electrically connected to other elements. In the embodiment, the first to third dummy patterns GDP1, GDP2, and GDP3, which are second conductive layers, may overlap the alignment areas AA of the third subpixel SPX3 in a plan view. Thus, the area overlapping the third conductive layer and the first conductive layer in a plan view may be maximized.

The first interlayer insulating layer IL1 may be disposed on the first to third dummy patterns GDP1, GDP2, and GDP3. The third conductive layer may be disposed on the first interlayer insulating layer ILL The third conductive layer may include a second capacitance electrode CSE2 and fourth conductive patterns DP4, which are spaced apart from each other in the first direction DR1. The second capacitance electrode CSE2 may overlap the third lower metal layer CAS3 of the second subpixel SPX2 in a plan view and may be extended to the third subpixel SPX3. The second capacitance electrode CSE2 may be disposed above the alignment area AA, and may overlap the second data line DTL2 and the second capacitance electrode CSE2 therebelow in a plan view. The fourth conductive pattern DP4 may be disposed below the second capacitance electrode CSE2 and electrically connected to the first data line DTL1. The fourth conductive pattern DP4 may be disposed to overlap the second data line DTL2, the first dummy pattern GDP1, and the second dummy pattern GDP2 in a plan view. The fourth conductive pattern DP4 disposed below the alignment area AA may be electrically connected to the second data line DTL2, and may be disposed to overlap the second data line DTL2 and the third dummy pattern GDP3 in a plan view. The second capacitance electrode CSE2 and the fourth conductive patterns DP4 may be disposed to overlap the second data line DTL2 in a plan view.

The via layer VIA may be disposed on the second capacitance electrode CSE2 and the fourth conductive patterns DP4. In the alignment area AA disposed on the right side of the third subpixel SPX3 among the alignment areas AA of the third subpixel SPX3, the third data line DTL3 that is the first conductive layer, the first and second dummy patterns GDP1 and GDP2 that are second conductive layers, and the second capacitance electrode CSE2 and the fourth conductive pattern DP4, which are the third conductive layers, may be disposed to overlap one another in a plan view.

In an embodiment, the area, in which the first conductive layer, the second conductive layer, and the third conductive layer overlap in the thickness direction, may be about 80% or more in the alignment area AA of the third subpixel SPX3. In an embodiment as shown in FIG. 18, the area, in which the second data line DTL2 that is the first conductive layer, the first to third dummy patterns GDP1, GDP2, and GDP3 that are the second conductive layers, and the second capacitance electrodes CSE2 and the fourth conductive patterns DP4, which are the third conductive layers, overlap one another in a plan view, may be about 80% or more in the alignment area AA extended in the first direction DR1. The second data line DTL2, the first to third dummy patterns GDP1, GDP2, and GDP3, the second capacitance electrodes CSE2, and the fourth conductive patterns DP4 may overlap one another at about 80% or more in the alignment area AA in a plan view. Thus, the via layer VIA formed on the upper portion may be generally flat. Therefore, as shown in FIG. 9, since the second insulating layer PAS2 exposing both ends of the light emitting element ED on the flat via layer VIA may be formed without distortion of a critical dimension, a contact defect between the light emitting element ED and the connection electrodes CNE may be avoided (or prevented).

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A display device comprising:

a plurality of conductive layers disposed on a substrate in different layers;

a via layer disposed on the plurality of conductive layers;

a bank disposed on the via layer and partitioning a light emission area;

bank patterns disposed on the via layer and extended in a first direction;

a first electrode disposed on the bank patterns and extended in the first direction;

a second electrode disposed on the bank patterns and extended in the first direction; and light emitting elements disposed on the first electrode and the second electrode, wherein the bank patterns are spaced apart from one another, the first electrode and the second electrode are spaced apart from one another, the bank and the bank patterns partition an alignment area in which the light emitting elements are disposed, and an area in which two or more of the plurality of conductive layers overlap one another in a plan view, is about 80% or more of an overall area of the alignment area surrounded by the bank and the bank patterns, in a plan view and defined as an area between the bank patterns.

2. The display device of claim 1, wherein the bank patterns include:

a first bank pattern overlapping the first electrode in a plan view; and a second bank pattern overlapping the second electrode in a plan view, and the alignment area is surrounded by the bank, the first bank pattern, and the second bank pattern.

3. The display device of claim 1, further comprising:

a first connection electrode that is in contact with an end of each of the light emitting elements; and a second connection electrode that is in contact with another end of each of the light emitting elements.

4. The display device of claim 1, wherein the plurality of conductive layers include:

a first conductive layer disposed on the substrate;

a second conductive layer disposed on the first conductive layer; and a third conductive layer disposed on the second conductive layer.

5. The display device of claim 4, wherein an area in which the first conductive layer and the third conductive layer overlap one another in a plan view, is about 80% or more in the alignment area.

6. The display device of claim 4, wherein an area in which the first conductive layer and the second conductive layer overlap one another in a plan view, is about 80% or more in the alignment area.

7. The display device of claim 4, wherein an area in which the first conductive layer, the second conductive layer, and the third conductive layer overlap one another in a plan view, is about 80% or more in the alignment area.

8. The display device of claim 4, further comprising:

a lower metal layer disposed on the substrate; and at least one transistor disposed on the lower metal layer, wherein the transistor includes:

a semiconductor layer;

a gate electrode disposed on the semiconductor layer;

a source electrode disposed on the gate electrode; and a drain electrode disposed on the gate electrode, the first conductive layer includes the lower metal layer, the second conductive layer includes the gate electrode, and the third conductive layer includes the source electrode and the drain electrode.

9. The display device of claim 4, further comprising:

a buffer layer disposed between the first conductive layer and the second conductive layer;

a gate insulating layer disposed between the first conductive layer and the second conductive layer; and an interlayer insulating layer disposed between the second conductive layer and the third conductive layer.

10. A display device comprising:

a plurality of pixels, each of the plurality of pixels including:

bank patterns disposed on a substrate, extended in a first direction, and spaced apart from one another in a second direction intersecting the first direction;

a bank disposed on the bank patterns and partitioning a light emission area, a plurality of first electrodes disposed on the bank patterns;

a plurality of second electrodes disposed on the bank patterns;

a plurality of subpixels including:

a first subpixel including a plurality of light emitting elements on a first electrode of the plurality of first electrodes and a second electrode of the plurality of second electrodes;

a second subpixel including a plurality of light emitting elements on a first electrode of the plurality of first electrodes and a second electrode of the plurality of second electrodes, and disposed adjacent to the first subpixel in a second direction; and a third subpixel including a plurality of light emitting elements on a first electrode of the plurality of first electrodes and a second electrode of the plurality of second electrodes, and disposed adjacent to the second subpixel in the second direction;

a first scan line extended in the first direction;

a first gate pattern overlapping the first scan line in a plan view and electrically connected to the first scan line; and a first conductive pattern overlapping the first scan line and the first gate pattern in a plan view and electrically connected to the first scan line, wherein the plurality of first electrodes and the plurality of second electrodes are spaced apart from one another in the second direction, the first scan line, the first gate pattern, and the first conductive pattern are disposed in the first subpixel, the bank and the bank patterns partition an alignment area, in which the light emitting elements are disposed, in each of the plurality of subpixels, and an area in which the first scan line and the first gate pattern overlap one another in a plan view, is about 80% or more of an overall area of the alignment area of the first subpixel surrounded by the bank and the bank patterns, in a plan view and defined as an area between the bank patterns.

11. The display device of claim 10, wherein the first scan line is disposed on the substrate, the first gate pattern is disposed on the first scan line, and the first conductive pattern is disposed on the first gate pattern.

12. The display device of claim 10, wherein an area in which the first scan line, the first gate pattern, and the first conductive pattern overlap one another in a plan view, is about 80% or more in the alignment area of the first subpixel.

13. The display device of claim 10, wherein the second subpixel includes:

a plurality of lower metal layers disposed on the substrate;

transistors disposed on the plurality of lower metal layers and electrically connected to the first electrode of the plurality of first electrodes disposed in each of the plurality of subpixels; and capacitors disposed on the plurality of lower metal layers and electrically connected to the first electrode of the plurality of first electrodes disposed in each of the plurality of subpixels, and each of the capacitors including:

a first capacitance electrode; and a second capacitance electrode overlapping the first capacitance electrode in a plan view.

14. The display device of claim 13, wherein an area in which the lower metal layer and the second capacitance electrode overlap one another in a plan view, is about 80% or more in the alignment area of the second subpixel.

15. The display device of claim 13, wherein an area in which the lower metal layer, the first capacitance electrode, and the second capacitance electrode overlap one another in a plan view, is about 80% or more in the alignment area of the second subpixel.

16. An electronic device comprising:

a plurality of pixels, each of the plurality of pixels including:

bank patterns disposed on a substrate, extended in a first direction, and spaced apart from one another in a second direction;

a bank disposed on the bank patterns and partitioning a light emission area, a plurality of first electrodes disposed on the bank patterns;

a plurality of second electrodes disposed on the bank patterns;

a plurality of subpixels including:

a first subpixel including a plurality of light emitting elements on a first electrode of the plurality of first electrodes and a second electrode of the plurality of second electrodes;

a second subpixel including a plurality of light emitting elements on a first electrode of the plurality of first electrodes and a second electrode of the plurality of second electrodes, and disposed adjacent to the first subpixel in a second direction; and a third subpixel including a plurality of light emitting elements on a first electrode of the plurality of first electrodes and a second electrode of the plurality of second electrodes, and disposed adjacent to the second subpixel in the second direction;

a first scan line extended in the first direction;

a first gate pattern overlapping the first scan line in a plan view and electrically connected to the first scan line; and a first conductive pattern overlapping the first scan line and the first gate pattern in a plan view and electrically connected to the first scan line, wherein the plurality of first electrodes and the plurality of second electrodes are spaced apart from one another in the second direction, the first scan line, the first gate pattern, and the first conductive pattern are disposed in the first subpixel, the bank and the bank patterns partition an alignment area, in which the light emitting elements are disposed, in each of the plurality of subpixels, and an area in which the first scan line and the first gate pattern overlap one another in a plan view, is about 80% or more in the alignment area of the first subpixel, wherein the third subpixel includes:

a first data line extended in the first direction;

a second data line extended in the first direction;

a third data line extended in the first direction;

second conductive patterns electrically connected to the first data line, the second data line, and the third data line, respectively; and a second capacitance electrode extended from the second subpixel, and the first to third data lines are spaced apart from one another in the second direction.

17. The electronic device of claim 16, wherein an area in which the second data line, the second conductive patterns, and the second capacitance electrode overlap one another in a plan view, is about 80% or more in the alignment area of the third subpixel.

18. The electronic device of claim 16, wherein the third subpixel includes:

a first dummy pattern disposed between the second data line and the second capacitance electrode;

a second dummy pattern disposed between the second data line and the second conductive patterns; and a third dummy pattern disposed between the second data line and the second conductive patterns, and an area in which the second data line, the first to third dummy patterns, the second conductive patterns, and the second capacitance electrode overlap one another in a plan view, is about 80% or more in the alignment area of the third subpixel.

19. The electronic device of claim 18, wherein the first data line, the second data line, and the third data line are disposed on the substrate, the first dummy pattern, the second dummy pattern, and the third dummy pattern are disposed on the first data line, the second data line, and the third data line, and the second capacitance electrode and the second conductive patterns are disposed on the first dummy pattern, the second dummy pattern, and the third dummy pattern.

20. The electronic device of claim 18, wherein the first dummy pattern, the second dummy pattern, and the third dummy pattern are spaced apart from one another, and are floating patterns.

* * * * *